(12) United States Patent
Diaz et al.

(10) Patent No.: US 11,777,009 B2
(45) Date of Patent: Oct. 3, 2023

(54) CONTACTS FOR HIGHLY SCALED TRANSISTORS

(71) Applicant: TAIWAN SEMICONDUCTOR MANUFACTURING COMPANY, LTD., Hsinchu (TW)

(72) Inventors: Carlos H. Diaz, Los Altos Hills, CA (US); Chung-Cheng Wu, Hsin-Chu County (TW); Chia-Hao Chang, Hsinchu (TW); Chih-Hao Wang, Hsinchu County (TW); Jean-Pierre Colinge, Blot L'Eglise (FR); Chun-Hsiung Lin, Hsinchu County (TW); Wai-Yi Lien, Hsinchu (TW); Ying-Keung Leung, Hsinchu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 17/694,043

(22) Filed: Mar. 14, 2022

(65) Prior Publication Data

US 2022/0208983 A1 Jun. 30, 2022

Related U.S. Application Data

(60) Division of application No. 16/681,927, filed on Nov. 13, 2019, now Pat. No. 11,276,763, which is a
(Continued)

(51) Int. Cl.
*H01L 29/76* (2006.01)
*H01L 29/94* (2006.01)
(Continued)

(52) U.S. Cl.
CPC ........ *H01L 29/45* (2013.01); *H01L 21/76852* (2013.01); *H01L 23/5226* (2013.01);
(Continued)

(58) Field of Classification Search
CPC .......... H01L 21/76852; H01L 23/5226; H01L 29/41733; H01L 29/41791;
(Continued)

(56) References Cited

U.S. PATENT DOCUMENTS 7,262,086 B2   8/2007   Yeo et al.
7,667,271 B2   2/2010   Yu et al.
(Continued)

*Primary Examiner* — Theresa T Doan
(74) *Attorney, Agent, or Firm* — HAYNES AND BOONE, LLP

(57) ABSTRACT

A semiconductor device and methods of forming the same are disclosed. The semiconductor device includes a substrate, first and second source/drain (S/D) regions, a channel between the first and second S/D regions, a gate engaging the channel, and a contact feature connecting to the first S/D region. The contact feature includes first and second contact layers. The first contact layer has a conformal cross-sectional profile and is in contact with the first S/D region on at least two sides thereof. In embodiments, the first contact layer is in direct contact with three or four sides of the first S/D region so as to increase the contact area. The first contact layer includes one of a semiconductor-metal alloy, an III-V semiconductor, and germanium.

20 Claims, 28 Drawing Sheets

Related U.S. Application Data continuation of application No. 15/933,560, filed on Mar. 23, 2018, now Pat. No. 10,497,792, which is a continuation of application No. 15/362,470, filed on Nov. 28, 2016, now Pat. No. 9,941,374, which is a division of application No. 14/872,673, filed on Oct. 1, 2015, now Pat. No. 9,508,858.

(60) Provisional application No. 62/081,348, filed on Nov. 18, 2014.

(51) Int. Cl.

| | | |
|---|---|---|
| *H01L 29/45* | (2006.01) | |
| *H01L 29/786* | (2006.01) | |
| *H01L 29/66* | (2006.01) | |
| *H01L 29/423* | (2006.01) | |
| *H01L 29/417* | (2006.01) | |
| *H01L 29/775* | (2006.01) | |
| *H01L 29/78* | (2006.01) | |
| *H01L 21/768* | (2006.01) | |
| *H01L 23/522* | (2006.01) | |
| *H01L 23/528* | (2006.01) | |
| *H01L 23/532* | (2006.01) | |

(52) U.S. Cl.
CPC .... *H01L 23/5283* (2013.01); *H01L 23/53271* (2013.01); *H01L 29/41733* (2013.01); *H01L 29/41741* (2013.01); *H01L 29/41791* (2013.01); *H01L 29/42392* (2013.01); *H01L 29/66666* (2013.01); *H01L 29/775* (2013.01); *H01L 29/785* (2013.01); *H01L 29/78618* (2013.01); *H01L 29/78642* (2013.01); *H01L 29/78696* (2013.01); *H01L 29/7827* (2013.01); *H01L 29/7853* (2013.01); *H01L 2029/7858* (2013.01)

(58) Field of Classification Search
CPC ............ H01L 29/42392; H01L 29/785; H01L 29/78618; H01L 29/78642; H01L 29/7827; H01L 29/7853; H01L 2029/7858

USPC ...................................................... 257/329
See application file for complete search history.

(56) References Cited

U.S. PATENT DOCUMENTS

| | | |
|---|---|---|
| 7,910,453 B2 | 3/2011 | Xu et al. |
| 8,377,779 B1 | 2/2013 | Wang |
| 8,399,931 B2 | 3/2013 | Liaw et al. |
| 8,652,894 B2 | 2/2014 | Lin et al. |
| 8,686,516 B2 | 4/2014 | Chen et al. |
| 8,716,765 B2 | 5/2014 | Wu et al. |
| 8,723,272 B2 | 5/2014 | Liu et al. |
| 8,729,627 B2 | 5/2014 | Cheng et al. |
| 8,735,993 B2 | 5/2014 | Lo et al. |
| 8,736,056 B2 | 5/2014 | Lee et al. |
| 8,742,492 B2 | 6/2014 | Chuang et al. |
| 8,754,470 B1 | 6/2014 | Chuang et al. |
| 8,772,109 B2 | 7/2014 | Colinge |
| 8,785,285 B2 | 7/2014 | Tsai |
| 8,815,691 B2 | 8/2014 | Colinge et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,508,858 B2 | 11/2016 | Diaz et al. |
| 9,941,374 B2 | 4/2018 | Diaz et al. |
| 10,497,792 B2 | 12/2019 | Diaz et al. |
| 2008/0242395 A1 | 10/2008 | Okada |
| 2008/0296632 A1 | 12/2008 | Moroz et al. |
| 2012/0168877 A1 | 7/2012 | Mukherjee et al. |
| 2013/0187207 A1 | 7/2013 | Tang et al. |
| 2013/0307513 A1 | 11/2013 | Then et al. |
| 2014/0001574 A1 | 1/2014 | Chen et al. |
| 2014/0110755 A1 | 4/2014 | Colinge |
| 2014/0151812 A1 | 6/2014 | Liaw |
| 2014/0203370 A1 | 7/2014 | Maeda |
| 2014/0312432 A1* | 10/2014 | Ching .................. H01L 29/785 257/288 |
| 2015/0060960 A1* | 3/2015 | Xie .................. H01L 21/76897 257/288 |
| 2015/0123166 A1 | 5/2015 | Jacob |
| 2020/0083341 A1 | 3/2020 | Diaz et al. |

* cited by examiner

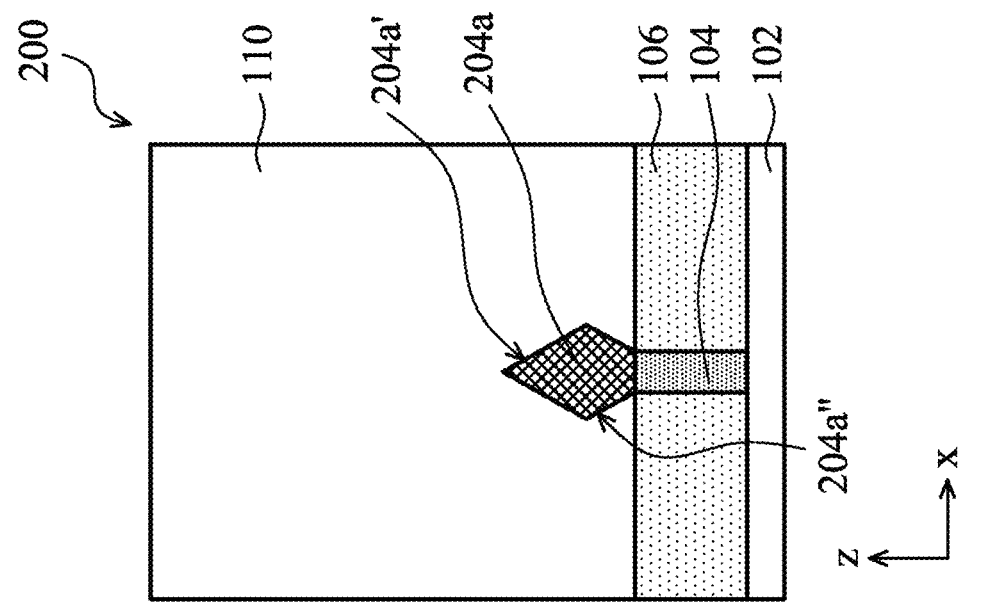
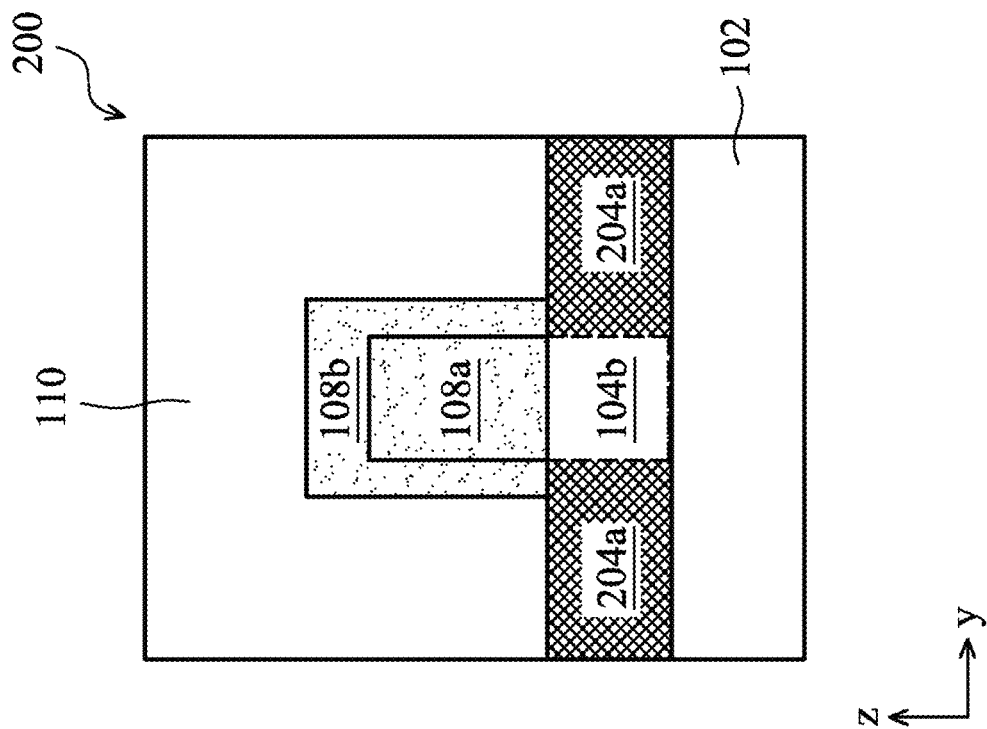
FIG. 6B
FIG. 6A

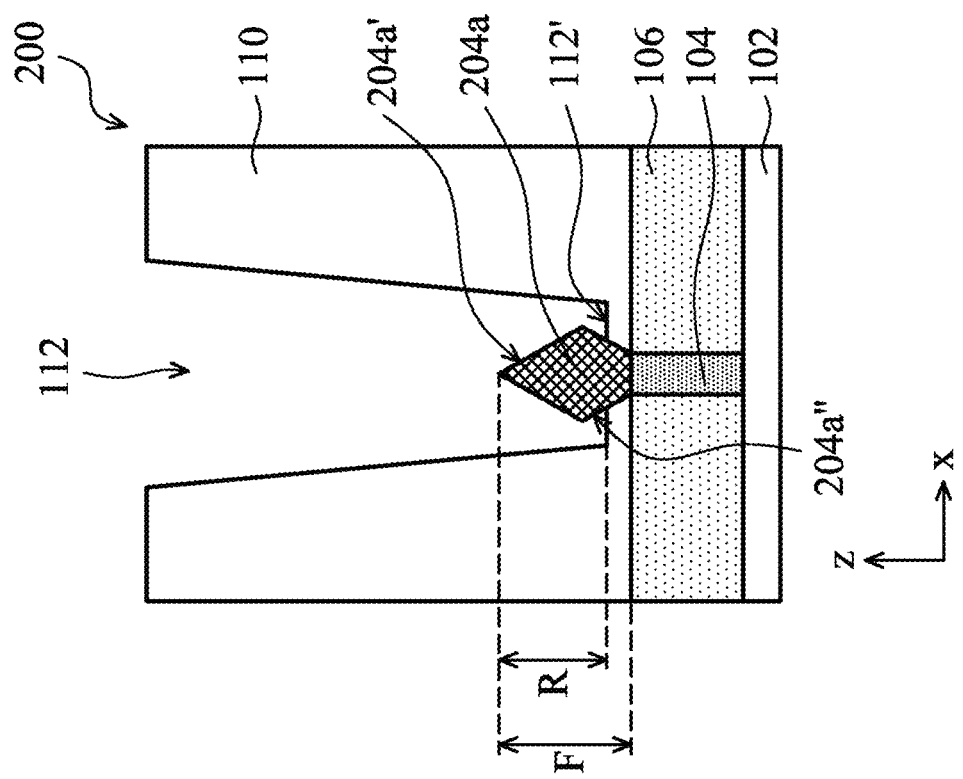
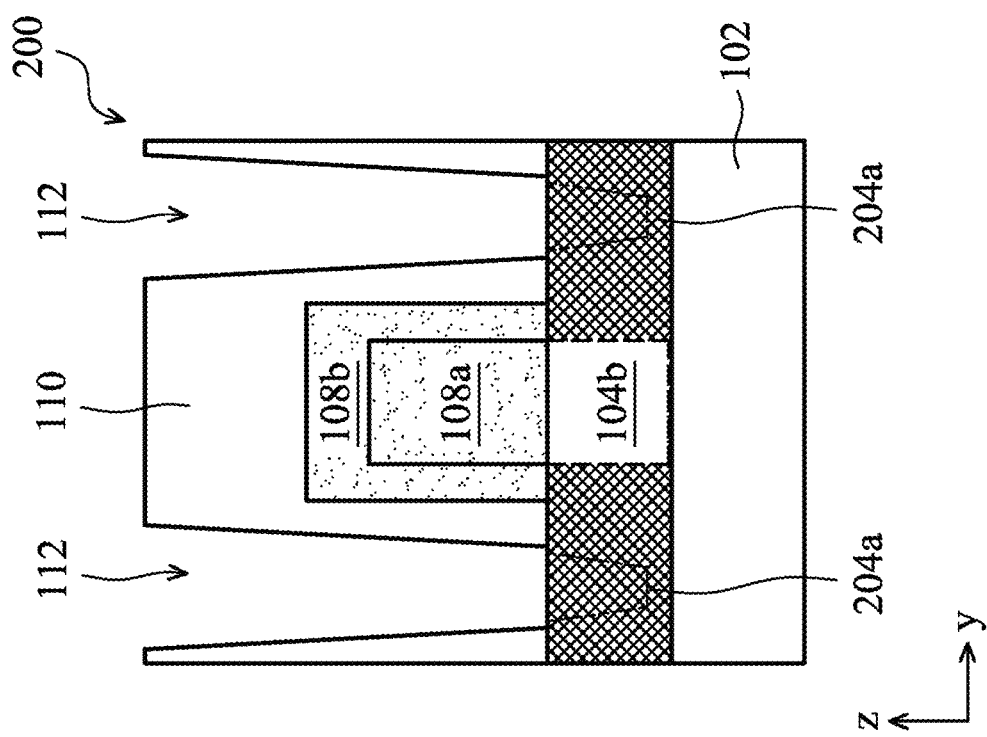
FIG. 7A
FIG. 7B

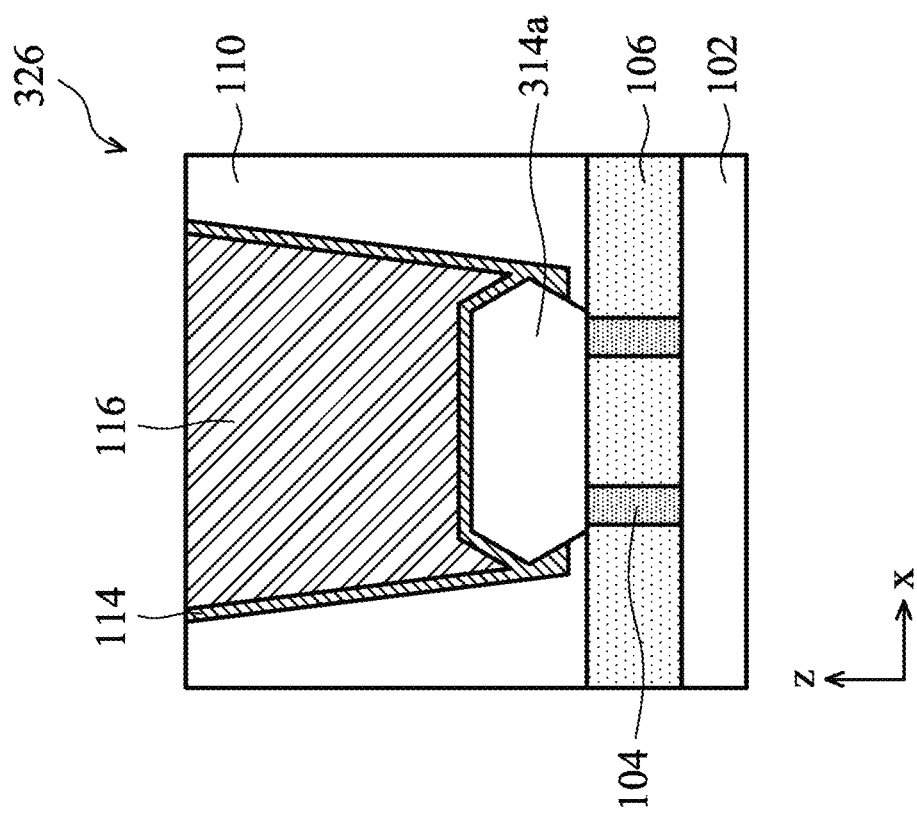
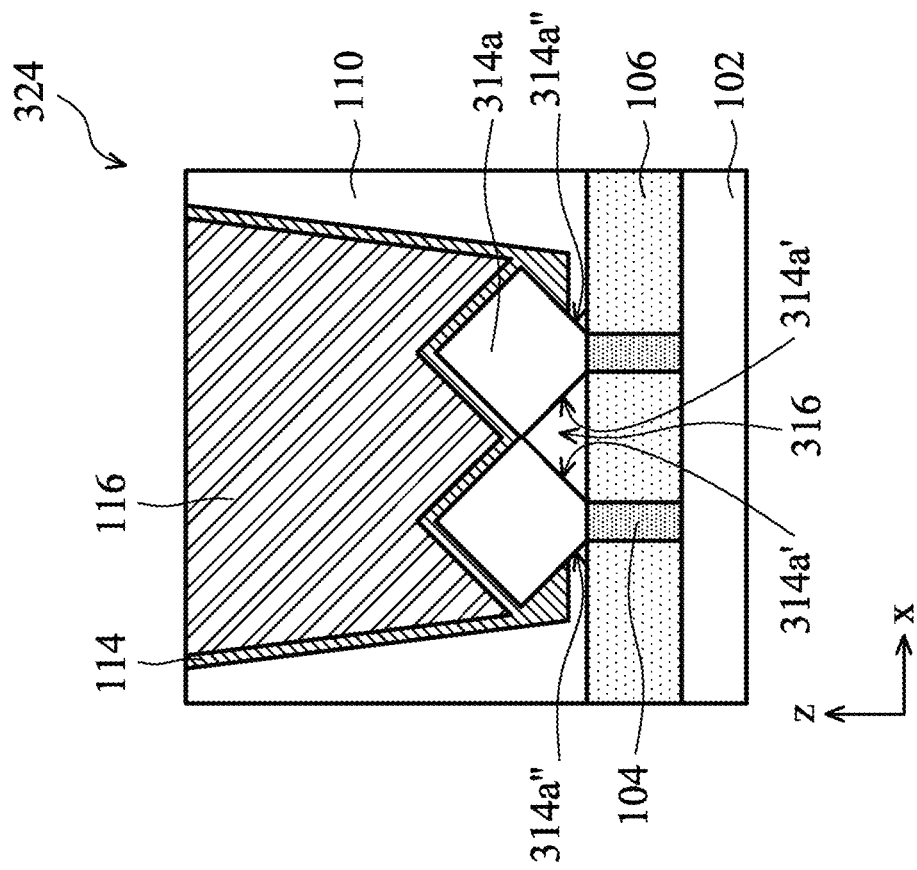
FIG. 10E
FIG. 10F

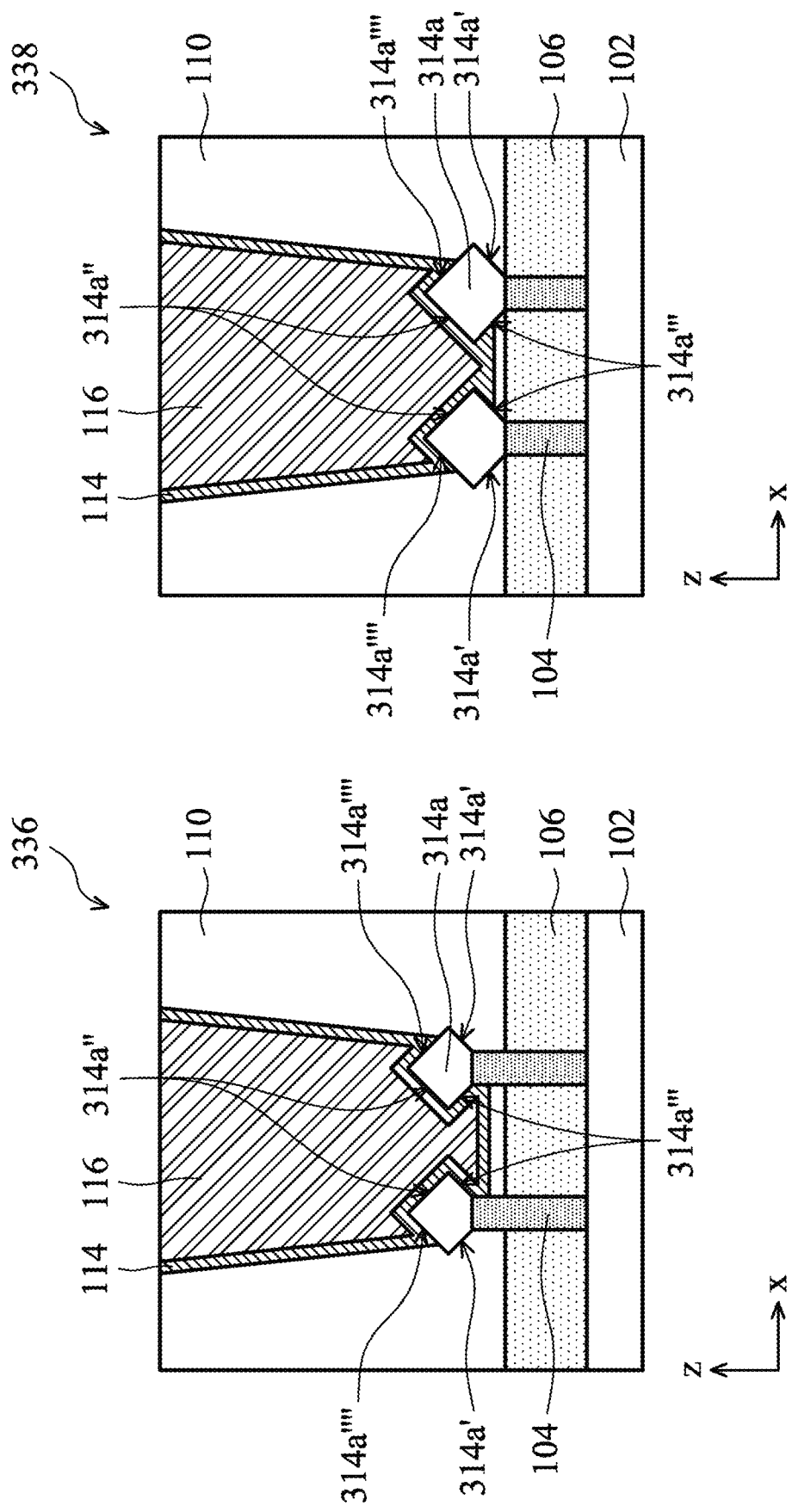

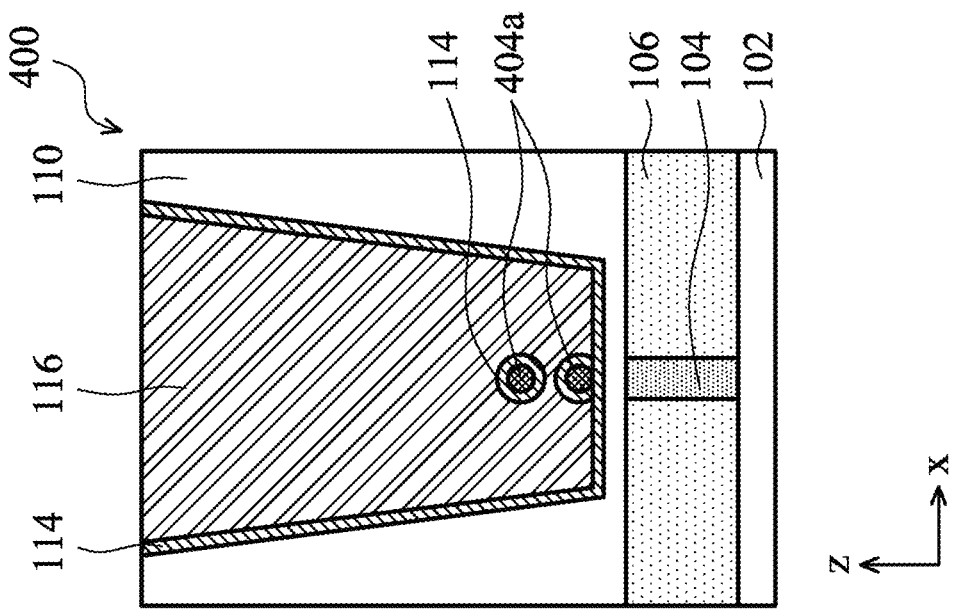
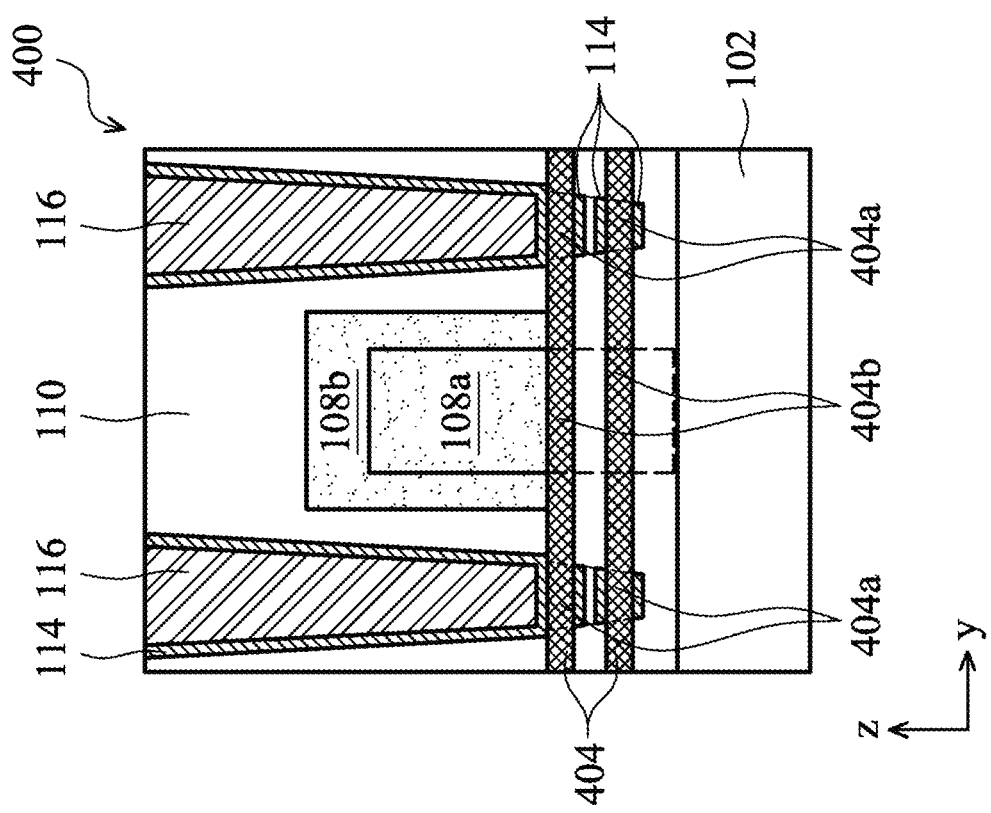
FIG. 11A
FIG. 11B

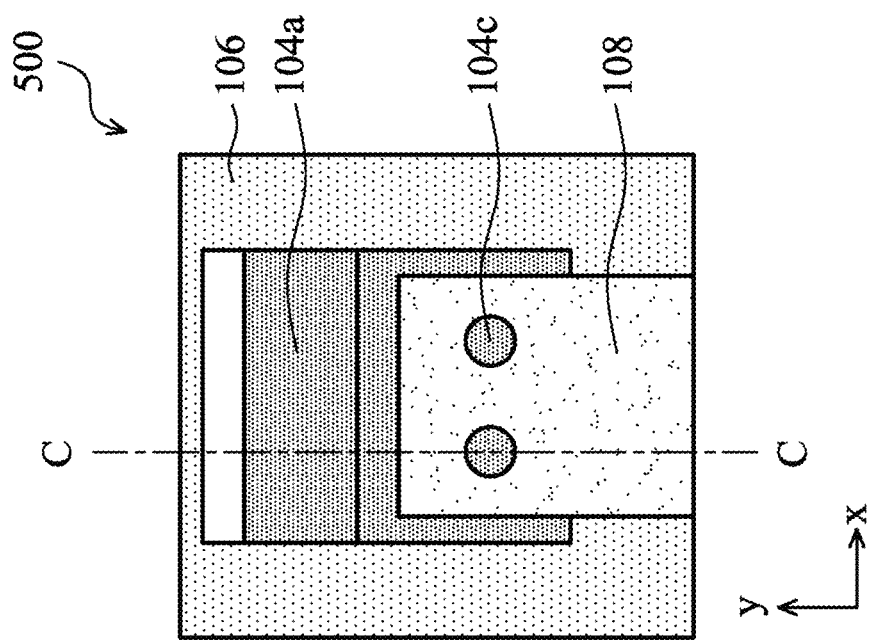
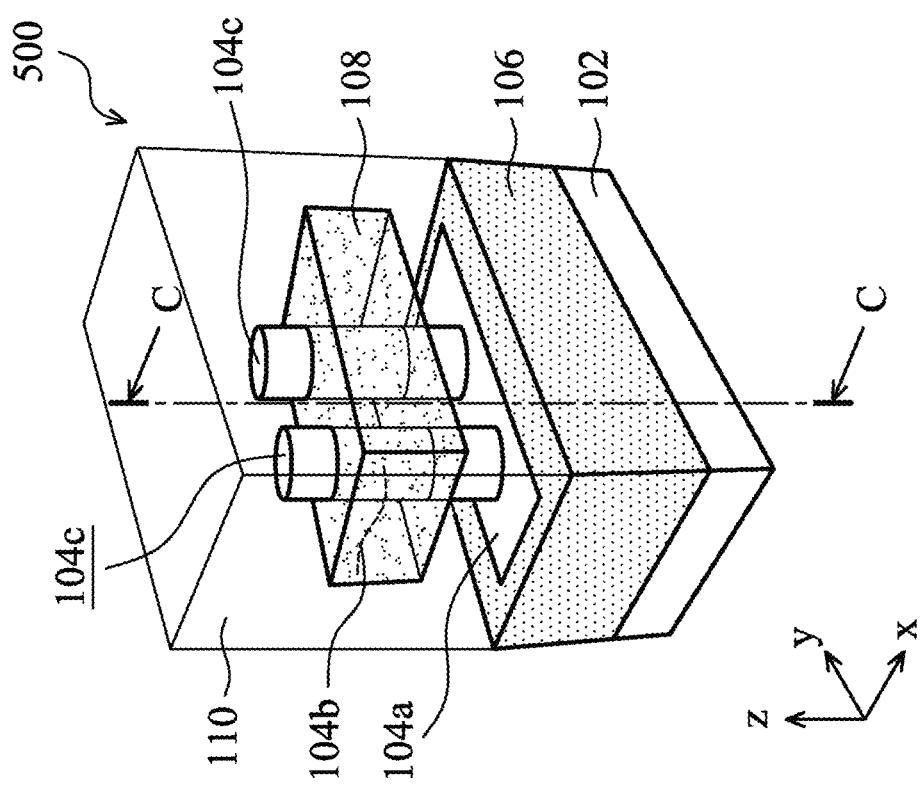
FIG. 13B
FIG. 13A

CONTACTS FOR HIGHLY SCALED TRANSISTORS

PRIORITY

The present application is a divisional application of U.S. application Ser. No. 16/681,927, filed Nov. 13, 2019, which is a continuation of U.S. application Ser. No. 15/933,560, filed Mar. 23, 2018, which is a continuation of U.S. application Ser. No. 15/362,470, filed Nov. 28, 2016, which is a divisional application of U.S. application Ser. No. 14/872,673, filed Oct. 1, 2015, which claims the benefit of U.S. Provisional Application No. 62/081,348 entitled "Contacts for Highly Scaled Transistors," filed Nov. 18, 2014, each of which is herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, multi-gate field effect transistors (FET) have been developed for their high drive currents, small footprints, and excellent control of short-channel effects. Examples of multi-gate FET include the double-gate FET, the triple-gate FET, the omega-gate FET, and the gate-all-around (or surround-gate) FET including both the horizontal gate-all-around (HGAA) FET and the vertical gate-all-around (VGAA) FET. The multi-gate FETs are expected to scale the semiconductor process technology beyond the limitations of the conventional bulk metal-oxide-semiconductor FET (MOSFET) technology. However, as the transistor device structure scales down and becomes three dimensional, the transistor contact resistance exhibits increased impact on the device performance. With conventional contact formation scheme, transistor contact resistance in highly scaled multi-gate FETs may limit the devices' intrinsic performance well over 50%.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 6A, 6B, 7A, 7B, 8A, 8B, 9A, and 9B are cross-sectional views of forming a semiconductor device according to the method of FIG. 1, in accordance with some embodiments.

FIGS. 10C, 10D, 10E, 10F, 10G, 10H, 10I, 10J, 10K, 10L, 10M, 10N, 10O, and 10P are cross-sectional views of semiconductor devices constructed in accordance with some embodiments of the method of FIG. 1.

FIGS. 11A and 11B are cross-sectional views of another semiconductor device constructed in accordance with some embodiments of the method of FIG. 1.

FIGS. 13A, 13B, 14A, 14B, 15, 16, 17, 18, and 19 are perspective and cross-sectional views of forming a semiconductor device according to the method of FIG. 2, in accordance with some embodiments.

DETAILED DESCRIPTION

Figure 1:
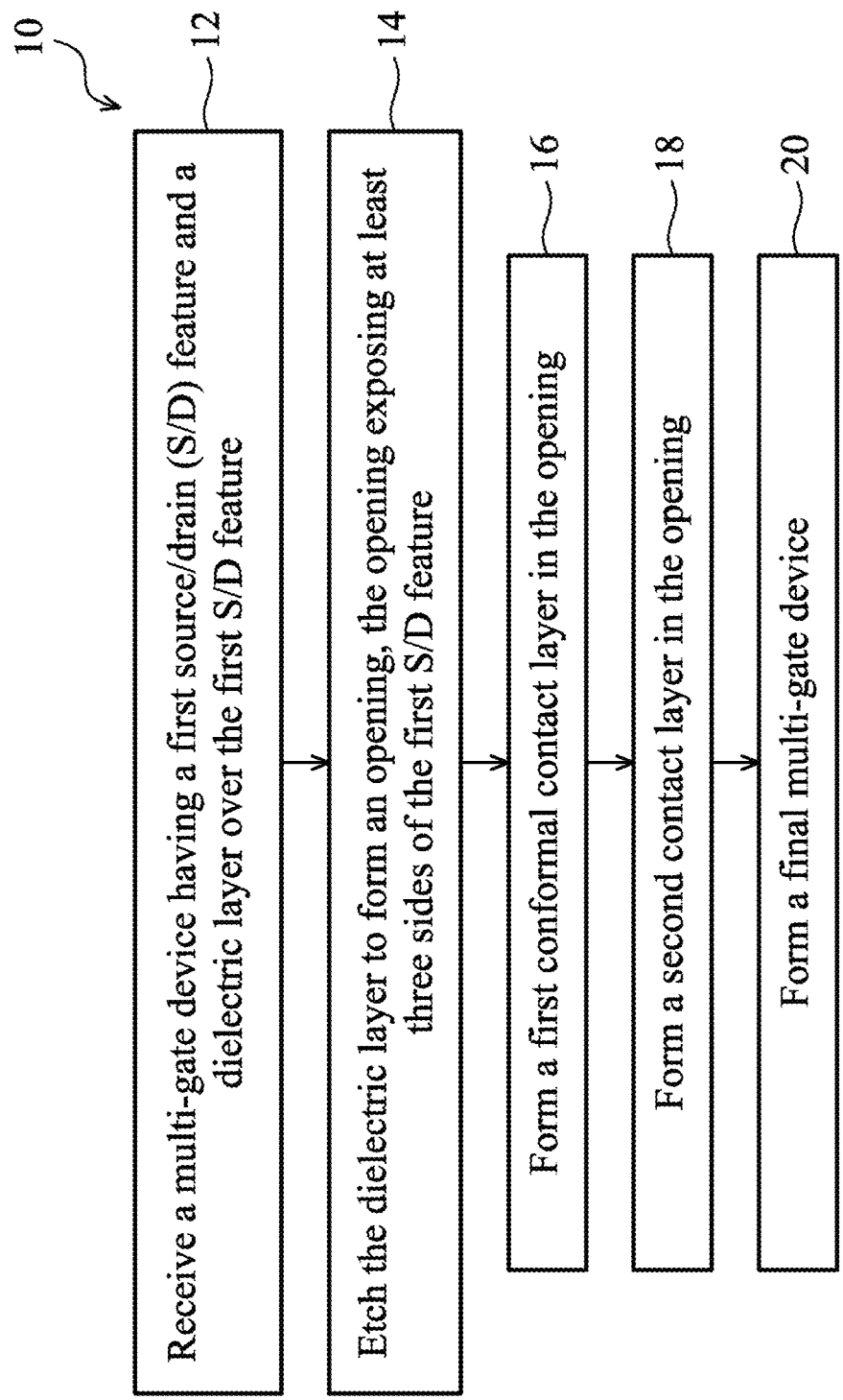
FIG. 1 shows a flow chart of a method of fabricating a semiconductor device, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices, and more particularly to semiconductor devices having multi-gate transistors such as horizontal multi-gate transistors and vertical multi-gate transistors. Examples of horizontal multi-gate transistors include the double-gate FET, the triple-gate FET, the omega-gate FET, and the horizontal gate-all-around (HGAA) FET. Examples of vertical multi-gate transistors include the vertical gate-all-around (VGAA) FET and tunneling FET (TFET). Furthermore, the HGAA FET and VGAA FET may include one or more of the nanowire channel, the bar-shaped channel, or other suitable channel structures. An objective of the present disclosure is to provide novel source/drain (S/D) contacts for the multi-gate transistors, wherein the novel S/D contacts have reduced contact resistance compared to the conventional S/D contacts.

In the following discussion, various embodiments of the present disclosure are described in the context of fabricating devices 100, 200, 300, 400, 500, 600, and 700. These devices are non-limiting examples that can be manufactured with some embodiments of the present disclosure. Furthermore, each of the devices 100, 200, 300, 400, 500, 600, and 700 may be an intermediate device fabricated during processing of an integrated circuit (IC), or a portion thereof, that may comprise static random access memory (SRAM) and/or other logic circuits, passive components such as resistors, capacitors, and inductors, and active components such as p-type FETs, n-type FETs, metal-oxide semiconductor field effect transistors (MOSFET), complementary metal-oxide semiconductor (CMOS) transistors, bipolar transistors, high voltage transistors, high frequency transistors, other memory cells, and combinations thereof.

First Embodiment

The first embodiment of the present disclosure is now described with reference to FIGS. 1-5B in fabricating the device 100. FIG. 1 shows a flow chart of a method 10 of forming a semiconductor device, such as a semiconductor device having a multi-gate structure, according to various aspects of the present disclosure. The method 10 is merely an example, and is not intended to limit the present disclosure beyond what is explicitly recited in the claims. Additional operations can be provided before, during, and after the method 10, and some operations described can be replaced, eliminated, or moved around for additional embodiments of the method.

Figure 2A:
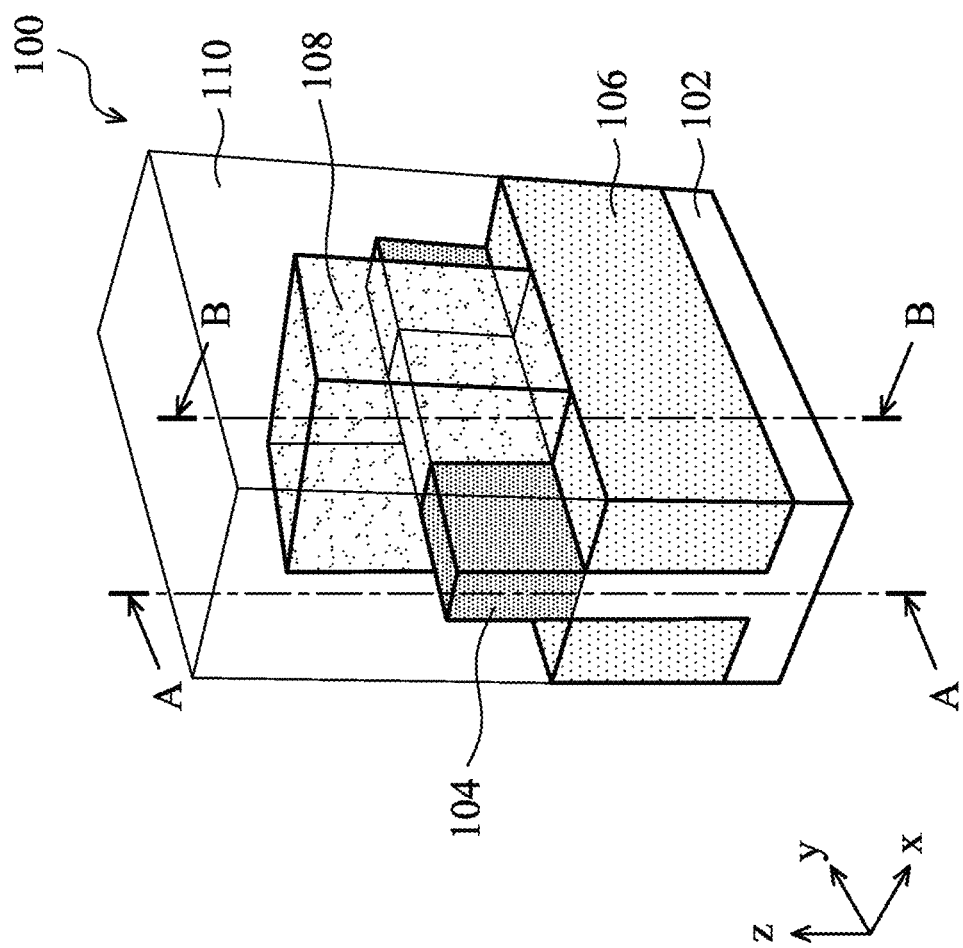
FIGS. 2A, 2B, 2C, 3A, 3B, 4A, 4B, 5A, and 5B are perspective and cross-sectional views of forming a semiconductor device according to the method of FIG. 1, in accordance with some embodiments.
Figure 2C:
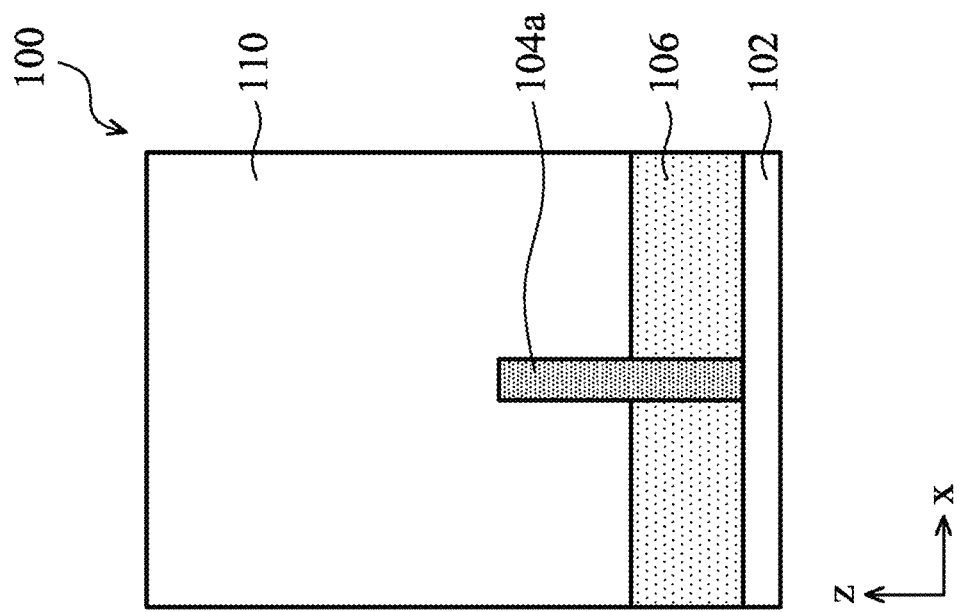
Figure 2B:
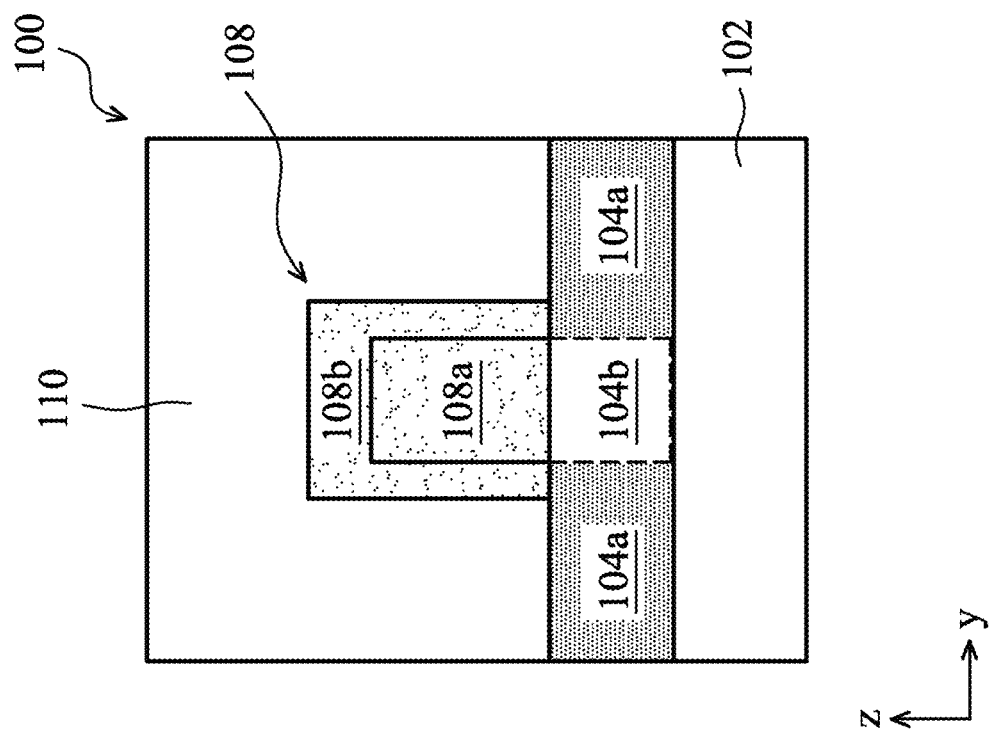

At operation 12, the method 10 (FIG. 1) receives the device 100 as shown in FIGS. 2A, 2B and 2C, wherein FIG. 2A is a perspective schematic view of the device 100, FIG. 2B is a cross-sectional view of the device 100 along the "A—A" line of FIG. 2A, and FIG. 2C is a cross-sectional view of the device 100 along the "B—B" line of FIG. 2A. Referring to FIGS. 2A, 2B, and 2C collectively, the device 100 includes a substrate 102, a fin 104, an isolation structure 106, a gate 108, and a dielectric layer 110. The fin 104 projects upwardly (along the "z" direction) from the substrate 102. The isolation structure 106 is disposed over the substrate and adjacent to a bottom portion of the fin 104. It isolates the fin 104 from other active regions (not shown) of the device 100. The gate 108 is formed over the isolation structure 106 and engages the fin 104 on three sides thereof. Therefore, the device 100 as shown is a triple-gate device. Other types of gate structures, such as double-gate (e.g., the gate 108 engages two side surfaces of the fin 104), omega-gate (e.g., the gate 108 fully engages a top surface and two side surfaces of the fin 104 and partially engages a bottom surface of the fin 104), and gate-all-around (e.g., the gate 108 fully engages top, bottom, and two side surfaces of the fin 104) are within the scope of the present disclosure. The dielectric layer 110 is disposed over the fin 104, the isolation structure 106, and the gate 108. The various elements of the device 100 will be further described in the following sections.

The substrate 102 is a silicon substrate in the present embodiment. Alternatively, the substrate 102 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The fin 104 is suitable for forming an n-type FET or a p-type FET. The fin 104 may be fabricated using suitable processes including photolithography and etch processes. The photolithography process may include forming a photoresist layer (resist) overlying the substrate 102, exposing the resist to a pattern, performing post-exposure bake processes, and developing the resist to form a masking element including the resist. The masking element is then used for etching recesses into the substrate 102, leaving the fin 104 on the substrate 102. The etching process can include dry etching, wet etching, reactive ion etching (RIE), and/or other suitable processes. Alternatively, the fin 104 may be formed using mandrel-spacer double patterning lithography. Numerous other embodiments of methods to form the fin 104 may be suitable.

The isolation structure 106 may be formed of silicon oxide, silicon nitride, silicon oxynitride, fluoride-doped silicate glass (FSG), a low-k dielectric material, and/or other suitable insulating material. The isolation structure 106 may be shallow trench isolation (STI) features. In an embodiment, the isolation structures 106 is formed by etching trenches in the substrate 102, e.g., as part of the fin 104 formation process. The trenches may then be filled with isolating material, followed by a chemical mechanical planarization (CMP) process. Other isolation structure such as field oxide, LOCal Oxidation of Silicon (LOCOS), and/or other suitable structures are possible. The isolation structure 106 may include a multi-layer structure, for example, having one or more thermal oxide liner layers.

The fin 104 and the gate 108 are further illustrated with reference to FIG. 2B. Referring to FIG. 2B, the fin 104 includes two source/drain (S/D) regions (or features) 104a and a channel region 104b between the two S/D regions 104a. The S/D regions 104a and the channel region 104b are arranged in a horizontal manner (along the "y" direction) over the isolation structure 106. Therefore, the device 100 is a horizontal multi-gate device. The gate 108 includes a gate stack 108a and a gate spacer 108b on sidewalls of the gate stack 108a. The gate stack 108a engages the fin 104 at the channel region 104b. In various embodiments, the gate stack 108a includes a multi-layer structure. In one example, the gate stack 108a includes an interfacial layer and a poly-silicon layer. In another example, the gate stack 108a includes an interfacial layer, a high-k dielectric layer, a barrier layer, a work function metal layer, and a metal fill layer. Various other embodiments of the gate stack 108a are possible. The gate stack 108a may be formed using either a "gate-first" or a "gate-last" method. In embodiments, the gate spacer 108b includes a dielectric material, such as silicon nitride or silicon oxynitride and is formed by one or more deposition and etching processes.

The dielectric layer 110, also referred to as an inter-layer dielectric (ILD) layer, is disposed over the various structures discussed above. In embodiments, the device 100 further includes a contact etch stop (CES) layer underneath the ILD layer 110. The ILD layer 110 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 110 may be deposited by a plasma-enhanced chemical vapor deposition (PECVD) process or other suitable deposition technique. In an embodiment, the ILD layer 110 is formed by a flowable CVD (FCVD) process. The FCVD process includes depositing a flowable material (such as a liquid compound) on the substrate 102 to fill trenches and converting the flowable material to a solid material by a suitable technique, such as annealing in one example. After various deposition processes, a chemical mechanical planarization (CMP) process is performed to planarize a top surface of the ILD layer 110.

Figure 3B:
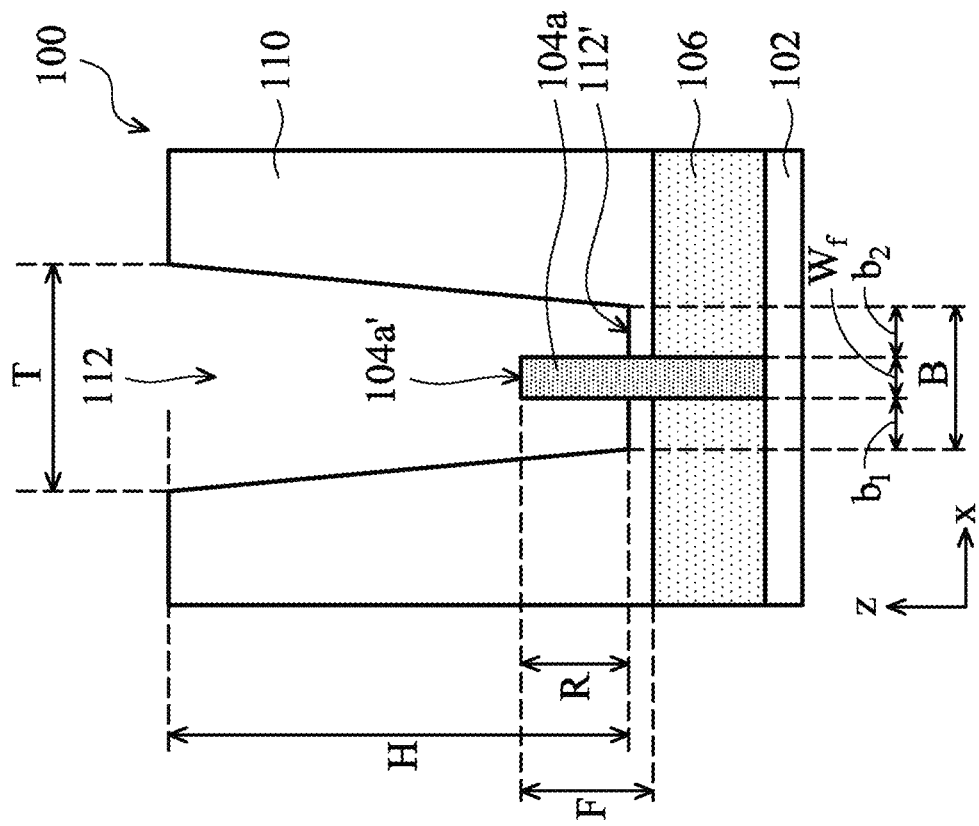
Figure 3A:
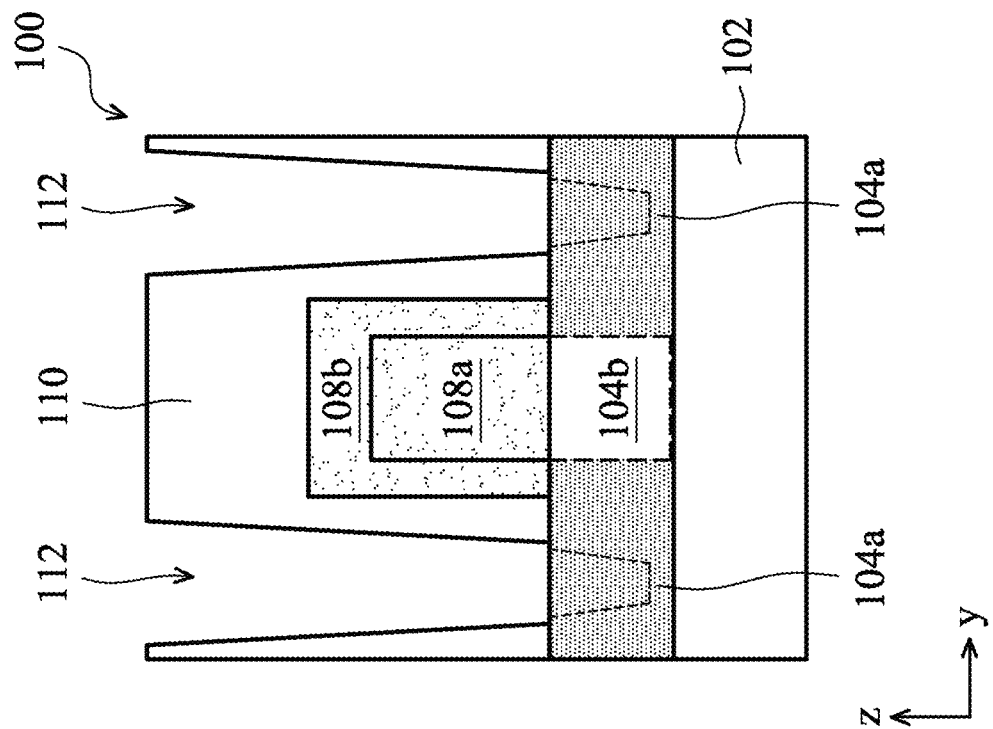

At operation 14, the method 10 (FIG. 1) etches the ILD layer 110 to form an opening (or a contact hole) 112. Referring to FIGS. 3A and 3B, FIG. 3A is a cross-sectional view of the device 100 along the "A—A" line of the FIG. 2A after the operation 14, and FIG. 3B is a cross-sectional view of the device 100 along the "B—B" line of the FIG. 2A after the operation 14. The opening 112 has a bottom surface 112' that is below a top surface 104a' of the fin 104a. The portion of the fin 104 exposed in the opening 112 has a height "R" which is also the vertical distance between the bottom surface 112' and the top surface 104a' along the z direction. The portion of the fin 104 above the isolation structure 106 has a height "F." In embodiments, R is greater than half of F. In some embodiments, R ranges from about 5 nanometer (nm) to about 60 nm. In an example, the opening 112 may be etched into the isolation structure 106. The opening 112 is deeper than conventional contact holes which typically stop at the top surface 104a'. One benefit of having a deep opening 112 is that an S/D contact formed therein will have larger contact areas with the S/D region 104a.

In various embodiments, the opening 112 has a top width T and a bottom width B along the x direction, and a height H along the z direction. The bottom width B is greater than the width $w_f$ of the fin 104a along the x direction. The top width T is greater than the bottom width B. Accordingly, the sidewalls of the opening 112 are slanted. The dimensions T, B, and H should be designed such that all surfaces of the opening 112 are easily accessible when a conductive material is deposited into the opening 112 to form a contact, as will be shown later. For the same consideration, the distances, $b_1$ and $b_2$, from the sidewalls of the opening 112 to the sidewalls of the fin 104a are designed such that the bottom and sidewalls of the opening 112 as well as the sidewalls of the fin 104a are easily accessible during the deposition of the conductive material. In various embodiments, T ranges from about 12 to about 40 nm, B ranges from about 8 to about 30 nm, and H ranges from about 50 to about 150 nm. In various embodiments, b1 and b2 each ranges from about half (½) of $w_f$ to about one and half (1½) of $w_f$. In addition, although FIG. 3B shows the opening 112 to be about symmetrical about the fin 104a in the z-x plane, this is merely exemplary in nature and does not limit the present disclosure. For example, in embodiments, $b_1$ and $b_2$ may be different.

The etching processes may include a suitable wet etch, dry (plasma) etch, and/or other processes. For example, a dry etching process may use chlorine-containing gases, fluorine-containing gases, other etching gases, or a combination thereof. The wet etching solutions may include $NH_4OH$, HF (hydrofluoric acid) or diluted HF, deionized water, TMAH (tetramethylammonium hydroxide), other suitable wet etching solutions, or combinations thereof.

In an embodiment, the device 100 includes a contact etch stop (CES) layer underneath the ILD layer 110 but over the S/D regions 104 and over the gate 108. For example, the CES layer may be made of a material similar to that for the isolation structure 106, such as silicon oxide or silicon nitride. During the operation 14, the CES layer protects the fin 104 from over-etching. If a contact hole to the gate 108 is etched at the same time, the CES layer further protects the gate 108 from over-etching. To further this embodiment, the operation 14 further includes an etching process tuned to remove the CES layer within the opening 112, thereby exposing the S/D regions 104a for contact formation.

In yet another embodiment, the device 100 includes a contact etch stop (CES) layer over the S/D regions 104 and over the gate 108. Prior to forming the ILD layer 110, the method 10 partially removes the CES layer so that the S/D regions 104a are exposed to provide top and sidewall surfaces for subsequent S/D contact formation. To further this embodiment, once the operation 14 removes the ILD layer 110 to form the opening 112, the fin surfaces for S/D contact formation are exposed.

Figure 4B:
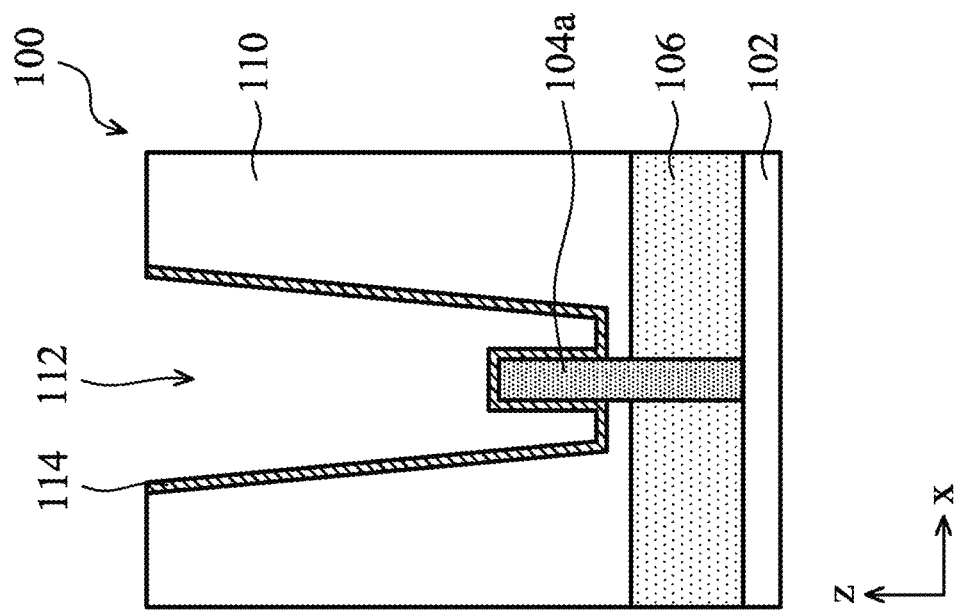
Figure 4A:
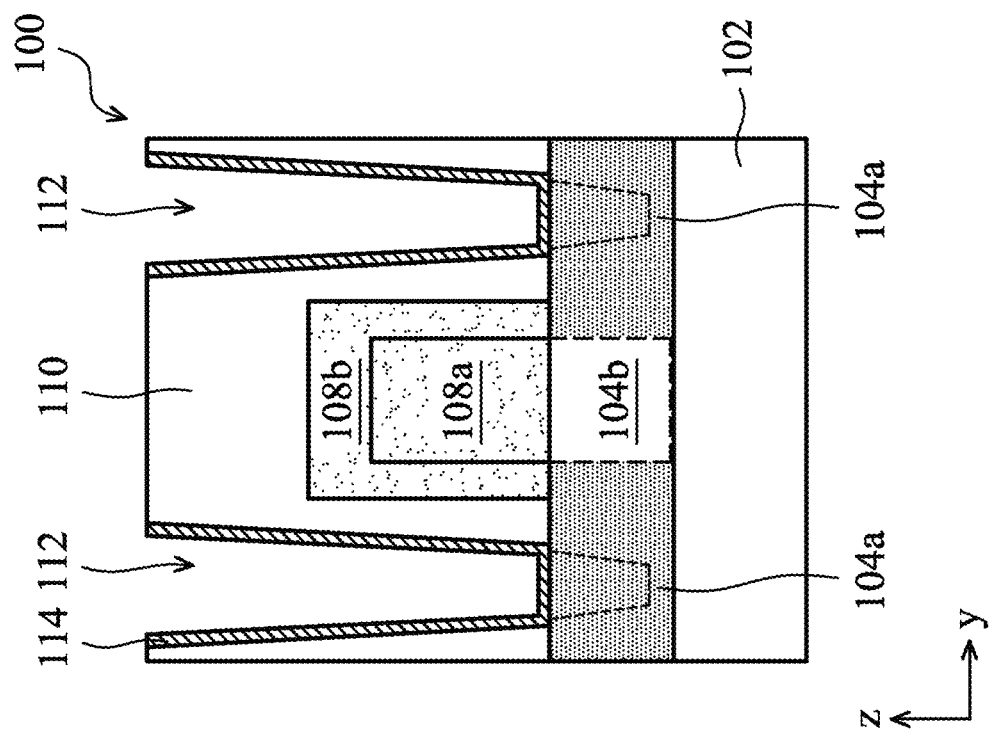

At operation 16, the method 10 (FIG. 1) forms a first contact layer 114 in the opening 112. Referring to FIGS. 4A and 4B, FIG. 4A is a cross-sectional view of the device 100 along the "A—A" line of the FIG. 2A after the operation 16, and FIG. 4B is a cross-sectional view of the device 100 along the "B—B" line of the FIG. 2A after the operation 16. The first contact layer 114 is formed over the surfaces of the opening 112. In particular, it is formed over the top surface and sidewalls of the S/D region 104a. The first contact layer 114 has a conformal profile, i.e. it has a near uniform thickness over the surfaces of the opening 112. In an embodiment, the first contact layer 114 has a thickness ranging from about 2 nm to about 10 nm. In an embodiment, the first contact layer 114 includes a semiconductor-metal alloy. For example, the semiconductor-metal alloy may include a metal material such as titanium, cobalt, nickel, nickel cobalt, other metals, or a combination thereof. To further this embodiment, the metal material is deposited using a chemical vapor deposition (CVD), physical vapor deposition (PVD), atomic layer deposition (ALD), or other suitable deposition techniques. Then, an annealing process is performed thereby forming a semiconductor-metal alloy over the surfaces of the S/D regions 104a. In another embodiment, the first contact layer 114 includes one or more III-V semiconductors that provide high carrier mobility and/or suitable band structure for tuning energy barrier. For example, the first contact layer 114 may include InAs, InGaAs, InP, or other suitable III-V semiconductors. In yet another embodiment, the first contact layer 114 includes germanium (Ge). In various embodiments, the first contact layer 114 may be deposited using CVD, PVD, ALD, or other suitable methods. In various embodiments, the material of the first contact layer 114 offers low or negligible energy barrier for charge carriers flowing into and out of the transistor channel. The first contact material coupled with increased contact area reduces the contact resistance to the S/D regions 104a.

Figure 5B:
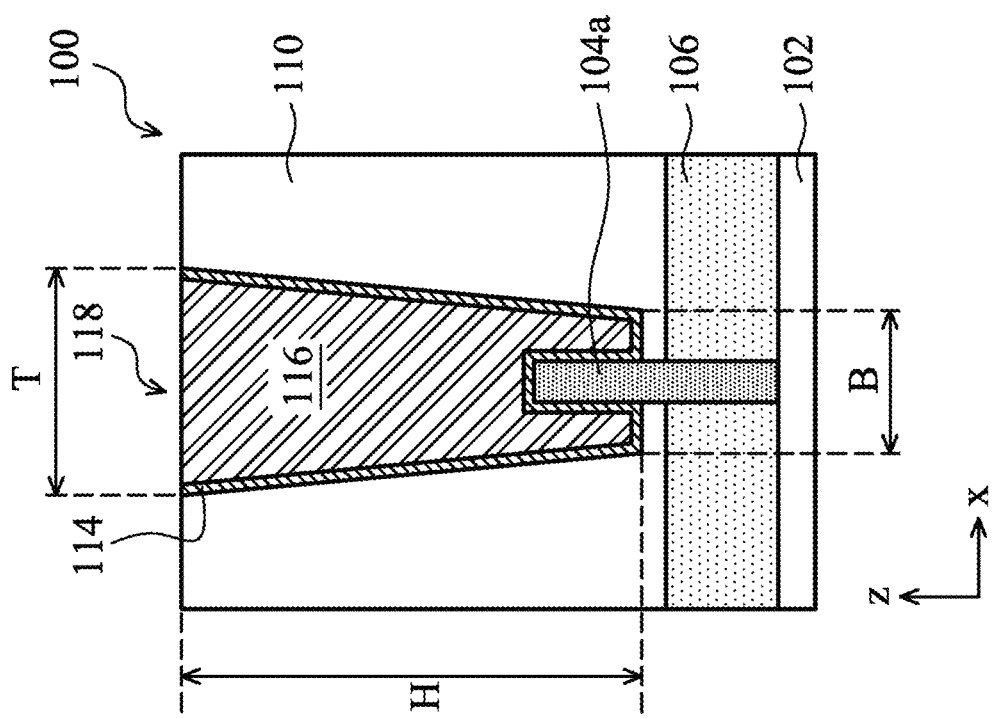
Figure 5A:
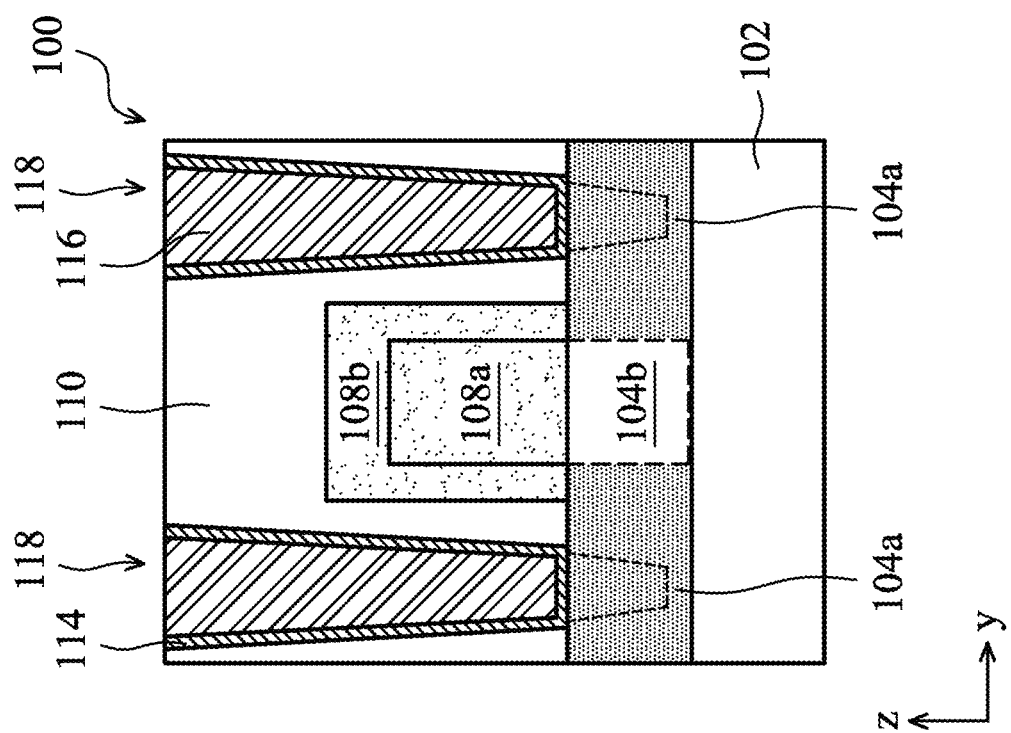

At operation 18, the method 10 (FIG. 1) forms a second contact layer 116 in the opening 112 over the first contact layer 114. Referring to FIGS. 5A and 5B, FIG. 5A is a cross-sectional view of the device 100 along the "A—A" line of the FIG. 2A after the operation 18, and FIG. 5B is a cross-sectional view of the device 100 along the "B—B" line of the FIG. 2A after the operation 18. The second contact layer 116 fills the remaining space of the opening 112. The second contact layer 116 may include one or more layers of metallic materials, such as metallic nitrides, metallic or conductive oxides, elemental metals, or combinations thereof. For example, the second contact layer 116 may use tungsten (W), copper (Cu), cobalt (Co), and/or other suitable materials. In various embodiments, the second contact layer 116 may be formed by CVD, PVD, plating, and/or other suitable processes. As shown in FIGS. 5A and 5B, an S/D contact 118 is formed in each of the openings 112, conductively connecting to the respective S/D regions 104a. The S/D contact 118 includes the first contact layer 114 and the second contact layer 116. Various dimensions of the S/D contact 118 are labeled in FIG. 5B, including a top width "T," a bottom width "B," and a height "H." The relationship among T, B, H, and the width $w_f$ of the fin 104a has been discussed with reference to FIG. 3B. In various embodiments, T ranges from about 12 to about 40 nm, B ranges from about 8 to about 30 nm, and H ranges from about 50 to about 150 nm.

At operation 20, the method 10 (FIG. 1) performs further steps to complete the fabrication of the device 100. For example, the operation 20 may form a gate contact electrically connecting the gate stack 108a, and may form metal interconnects connecting the multi-gate FET to other portions of the device 100 to form a complete IC.

Second Embodiment

The second embodiment of the present disclosure is now described with reference to FIGS. 1 and 6A-9B, wherein the device 200 is fabricated according to some embodiments of the method 10. FIGS. 6A-9B illustrate cross-sectional views of the device 200 in the process of fabrication. Discussions applicable to both the devices 100 and 200 are abbreviated or omitted below for the sake of simplicity.

At the operation 12, the method 10 (FIG. 1) receives the device 200, which is similar to the device 100 (FIGS. 2A-2C) in many respects. For the purpose of simplicity, same reference numerals are used to label similar elements of the two devices. For example, as shown in FIGS. 6A and 6B, the device 200 also includes a substrate 102, a fin 104, an isolation structure 106, a gate 108, and an ILD layer 110. The gate 108 also includes a gate stack 108a and a gate spacer 108b. The gate stack 108a engages a channel region 104b of the fin 104. One difference between the devices 100 and 200 lies in the structure of the S/D regions of the two devices. As shown in FIG. 6B, the device 200 has diamond-shaped S/D regions 204a. In an embodiment, the S/D regions 204a are formed by etching a portion of the fin 104 of the device 200 to form recesses therein and epitaxially growing one or more semiconductor features from the recesses. For example, the etching process may use a dry etching, a wet etching, or other suitable etching methods. A cleaning process may be performed that cleans the recesses with a hydrofluoric acid (HF) solution or other suitable solution. Subsequently, one or more epitaxial growth processes are performed to grow semiconductor (e.g., silicon) features in the recesses. The epitaxial growth process may in-situ dope the grown semiconductor with a p-type dopant for forming a p-type FET or an n-type dopant for forming an n-type FET. As further illustrated in FIG. 6B, the S/D regions 204a each have two upwardly facing surfaces (or sides) 204a' and two downwardly facing surfaces (or sides) 204a").

At the operation 14, the method 10 (FIG. 1) etches the ILD layer 110 of the device 200 to form an opening 112 therein. Referring to FIGS. 7A and 7B, the opening 112 has a bottom surface 112' that is below the surfaces 204a'. The portion of the fin 104/204a exposed in the opening 112 has a height "R." The portion of the fin 104/204a above the isolation structure 106 has a height "F." In embodiments, R is greater than half of F. In embodiments, the opening 112 fully exposes the surface 204 a' and may partially or fully expose the surfaces 204a". In some embodiments, R ranges from about 5 nanometer (nm) to about 60 nm. The opening 112 is deeper than conventional contact holes which typically stop at the surfaces 204a'. One benefit of having deeper openings 112 is that S/D contacts formed therein will have larger contact areas with the S/D regions 204a. Other respects of this operation are similar to those discussed with reference to FIGS. 3A and 3B.

Figure 8B:
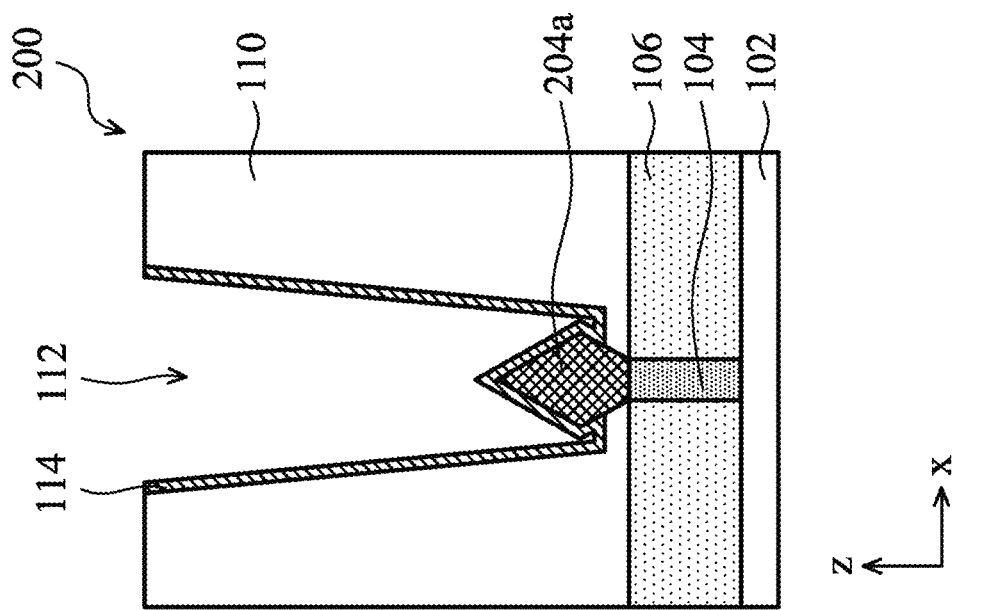
Figure 8A:
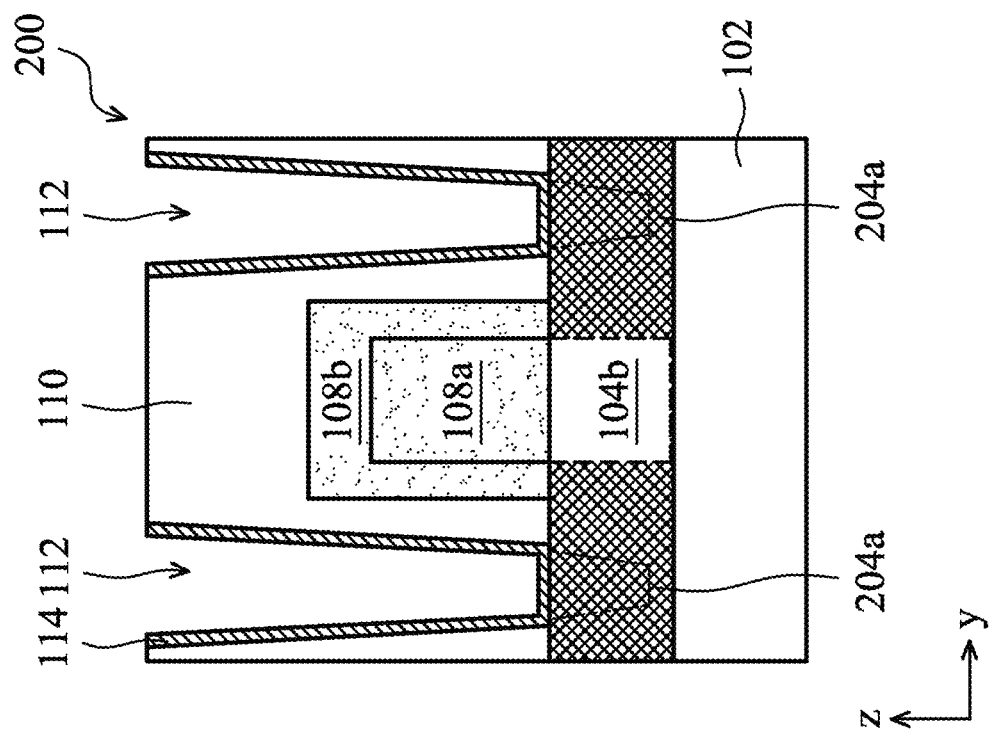

At the operation 16, the method 10 (FIG. 1) forms a first contact layer 114 in the opening 112. Referring to FIGS. 8A and 8B, the first contact layer 114 is formed over the surfaces of the opening 112. In particular, it is formed over the surfaces 204a' and 204a" (FIG. 7B) of the S/D region 204a. The first contact layer 114 has a conformal profile. In an embodiment, the first contact layer 114 has a thickness ranging from about 2 nm to about 10 nm. The material and formation of the first contact layer 114 are similar to those discussed with reference to FIGS. 4A and 4B. In various embodiments, the material of the first contact layer 114 offers low or negligible energy barrier for charge carriers flowing into and out of the transistor channel. The first contact material coupled with increased contact area to the S/D regions 204a reduces the contact resistance thereof.

Figure 9B:
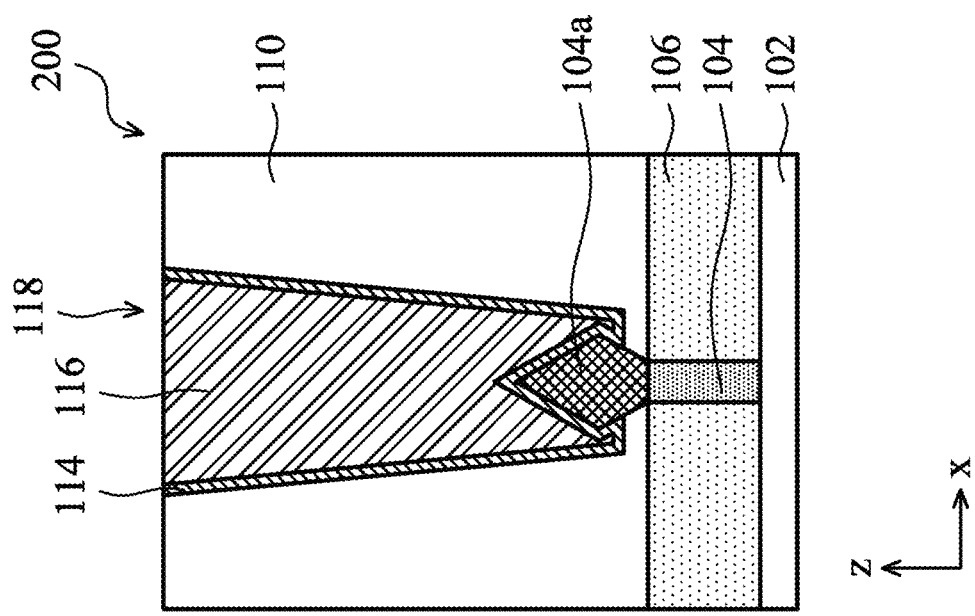
Figure 9A:
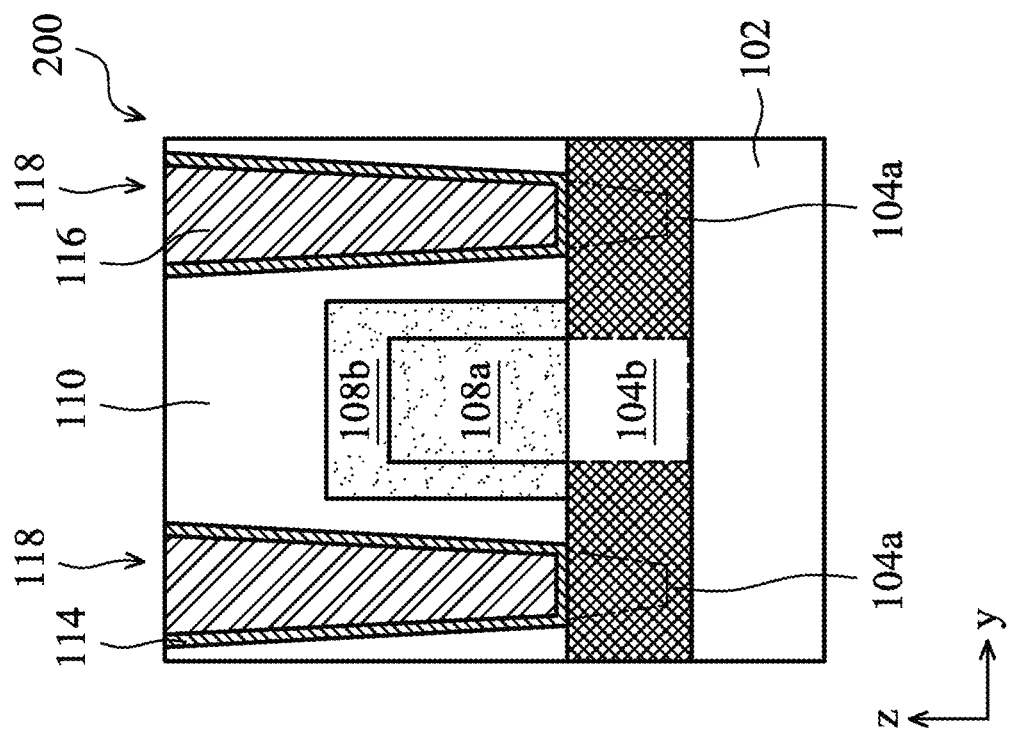

At the operation 18, the method 10 (FIG. 1) forms a second contact layer 116 in the opening 112 over the first contact layer 114. Referring to FIGS. 9A and 9B, an S/D contact 118 is formed in each of the openings 112, conductively connecting to the respective S/D regions 204a. The S/D contact 118 includes the first contact layer 114 and the second contact layer 116. Other respects of the contact 118, such as dimensions, are similar to those discussed with reference to FIGS. 5A and 5B.

Third Embodiment

The third embodiment of the present disclosure is now described with reference to FIGS. 10A and 10B, wherein the device 300 has been fabricated according to some embodiments of the method 10. Discussions applicable to both the devices 100 and 300 are abbreviated or omitted below for the sake of simplicity.

Figure 10B:
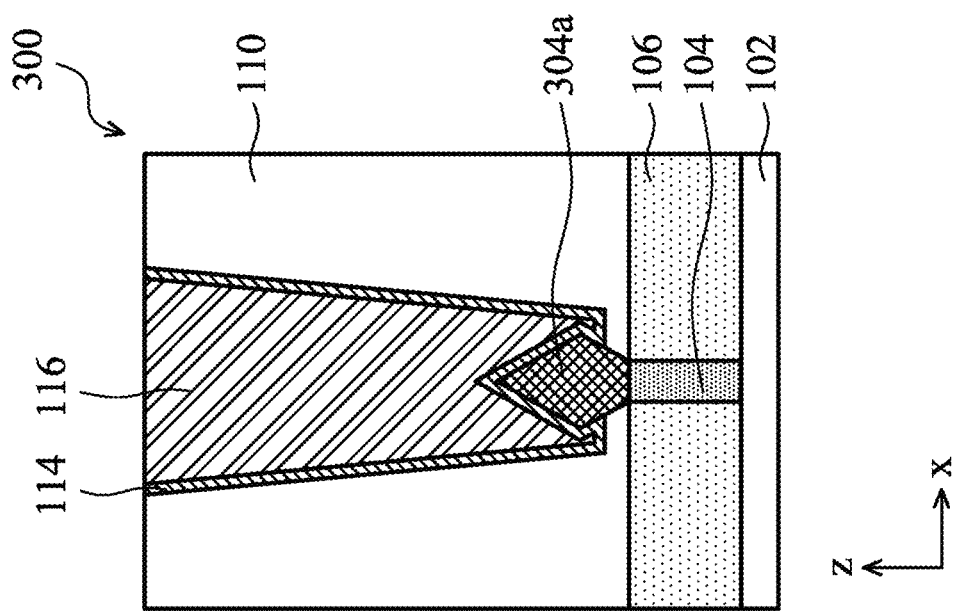
FIGS. 10A and 10B are cross-sectional views of a semiconductor device constructed in accordance with some embodiments of the method of FIG. 1.
Figure 10A:
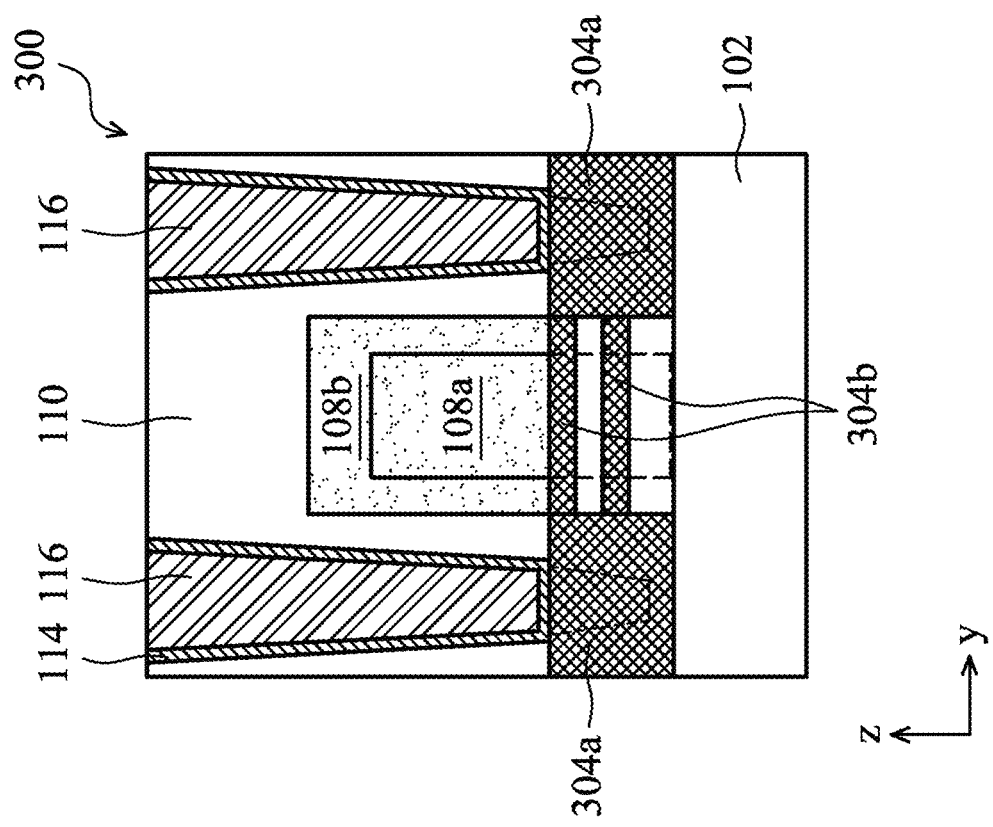

Referring to FIGS. 10A and 10B, the device 300 includes two horizontal (in the "x-y" plane) rod-shaped channels 304b. In embodiments, the number of channels and the shape of the channels in the device 300 may vary. For example, the channels 304b may be bar-shaped or have other suitable shapes, and there may be one or more channels. The device 300 includes a gate 108 that wraps around the channels 304b. Hence, the device 300 is a horizontal gate-all-around (HGAA) device. Other respects of the device 300 are the same as or similar to those of the device 200. For example, the device 300 also includes diamond-shaped S/D regions 304a formed over the substrate 102 and the fin 104. The process of forming S/D contacts for the device 300 is the same as what have been discussed with respect to the devices 100 and 200. An exemplary process of forming the device 300 prior to the S/D contact formation can be found in U.S. Pat. No. 8,815,691 entitled "Method of Fabricating a Gate All Around Device," the contents of which are hereby incorporated by reference in their entirety.

Examples of the First, Second, and Third Embodiments

Figure 10D:
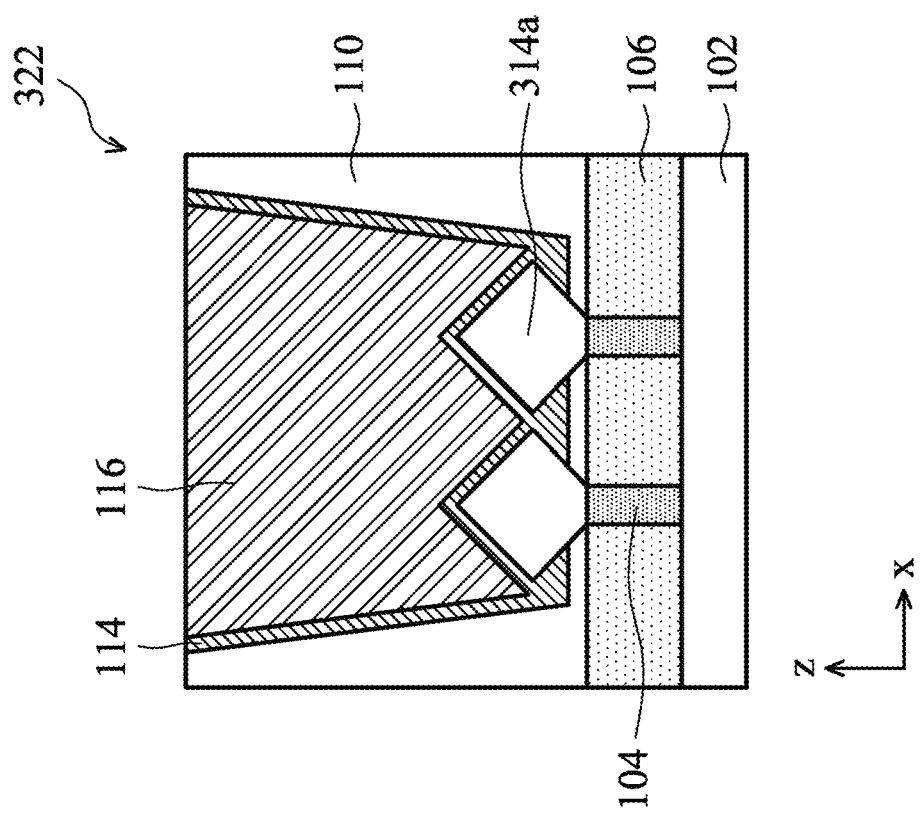
Figure 10C:
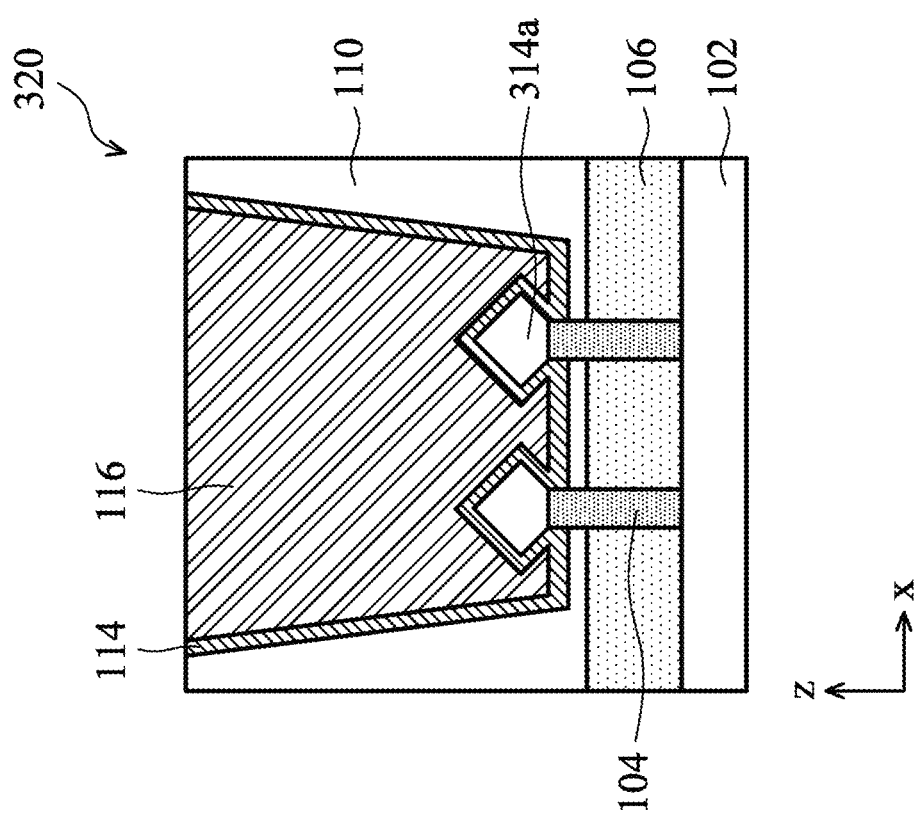
Figure 10G:
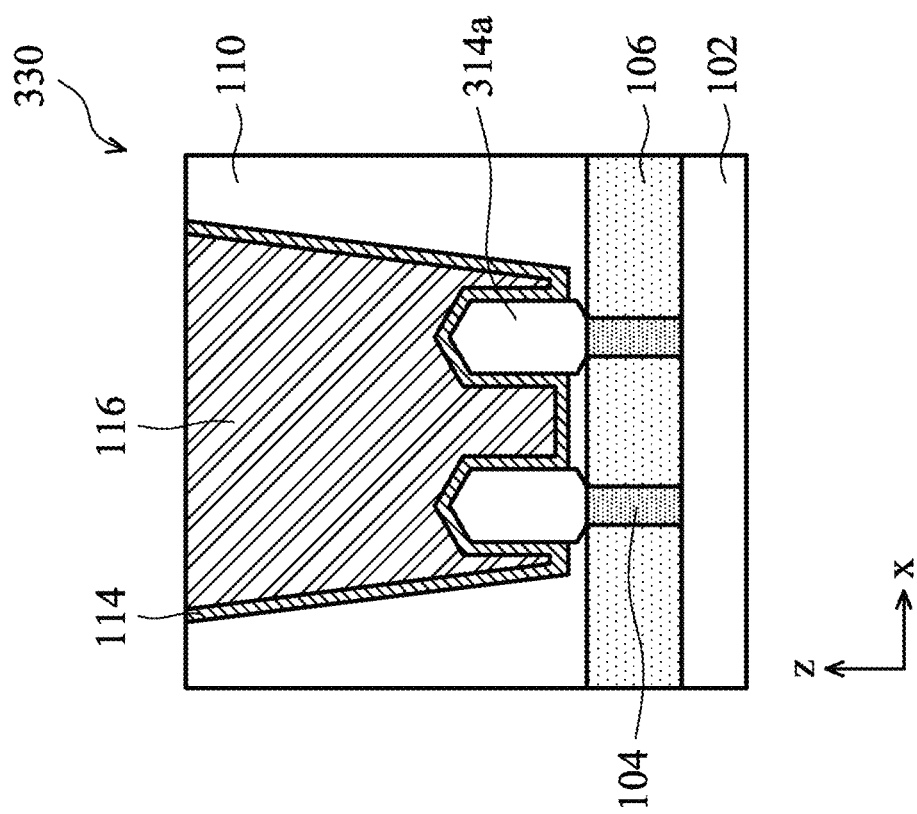
Figure 10H:
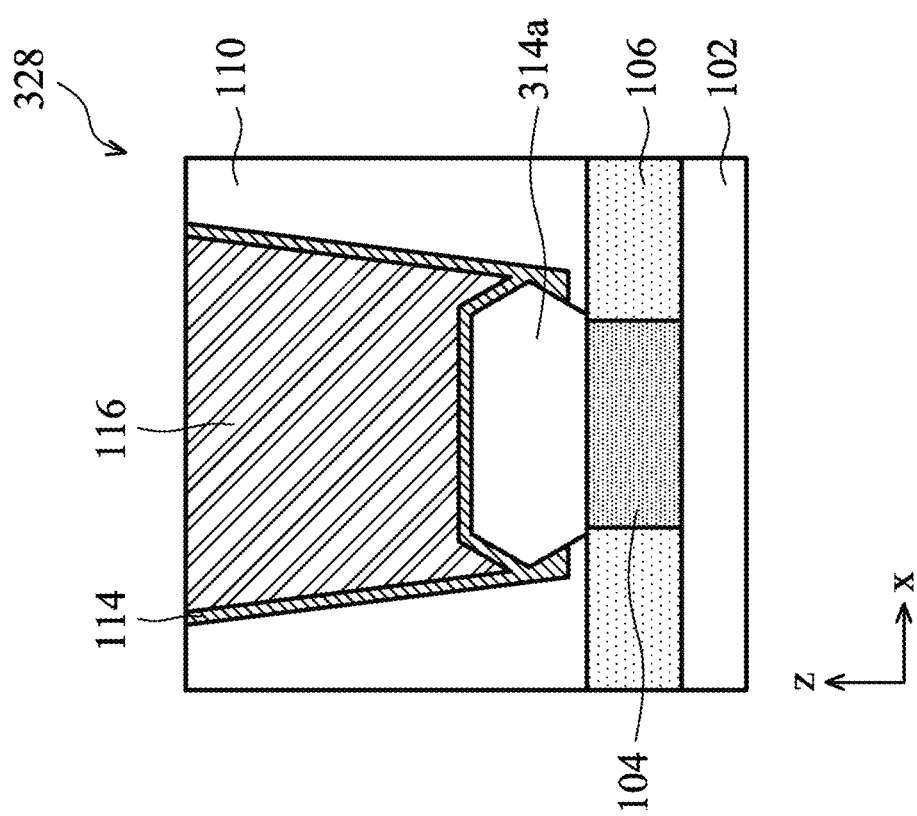
Figure 10J:
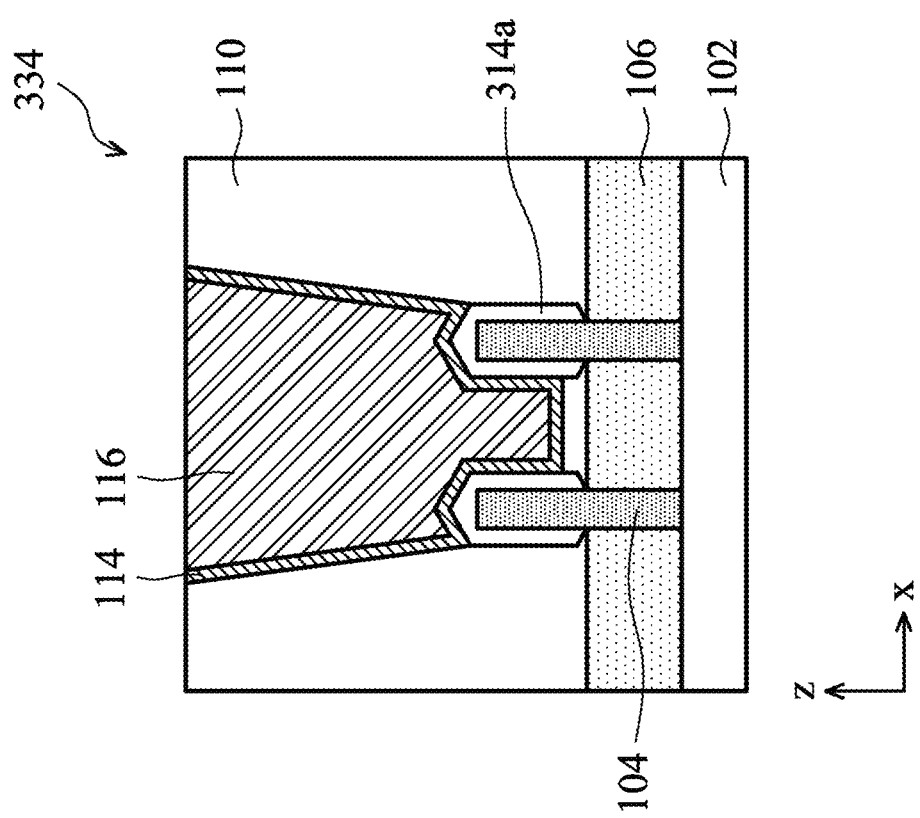
Figure 10I:
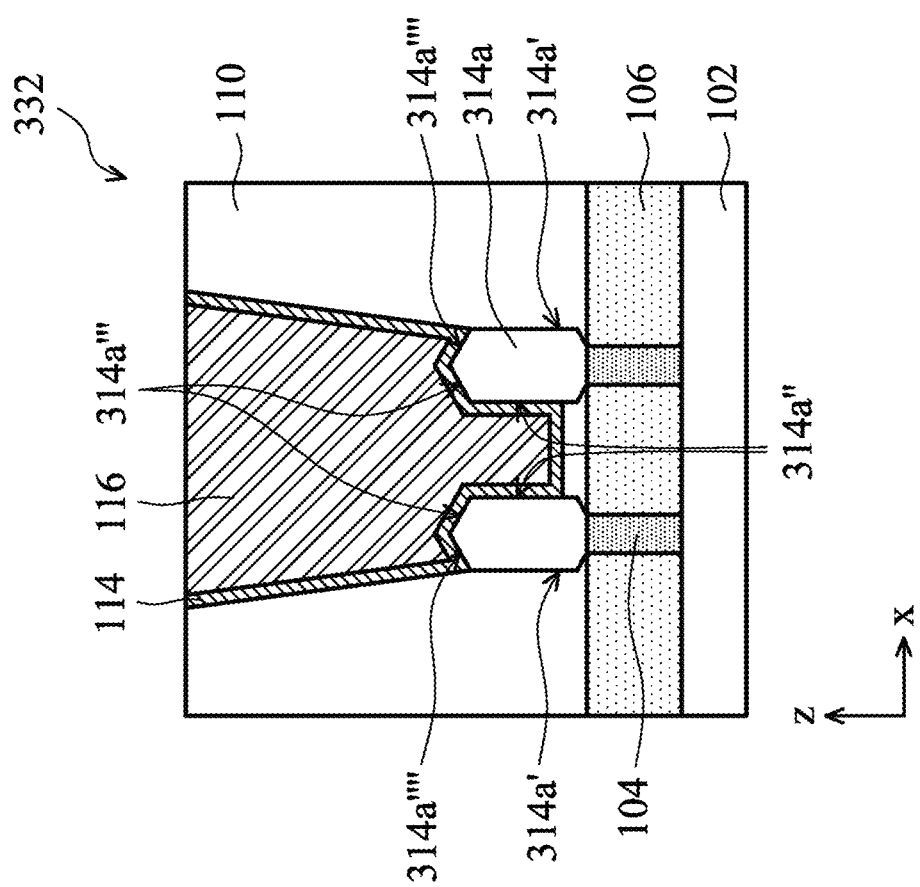
Figure 10N:
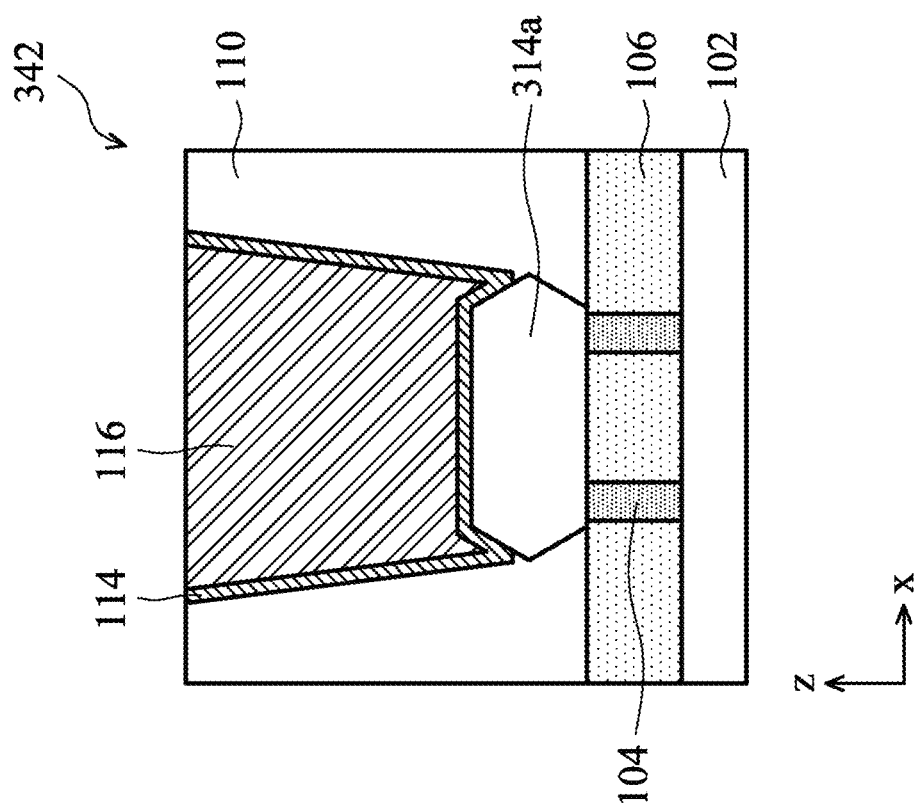
Figure 10M:
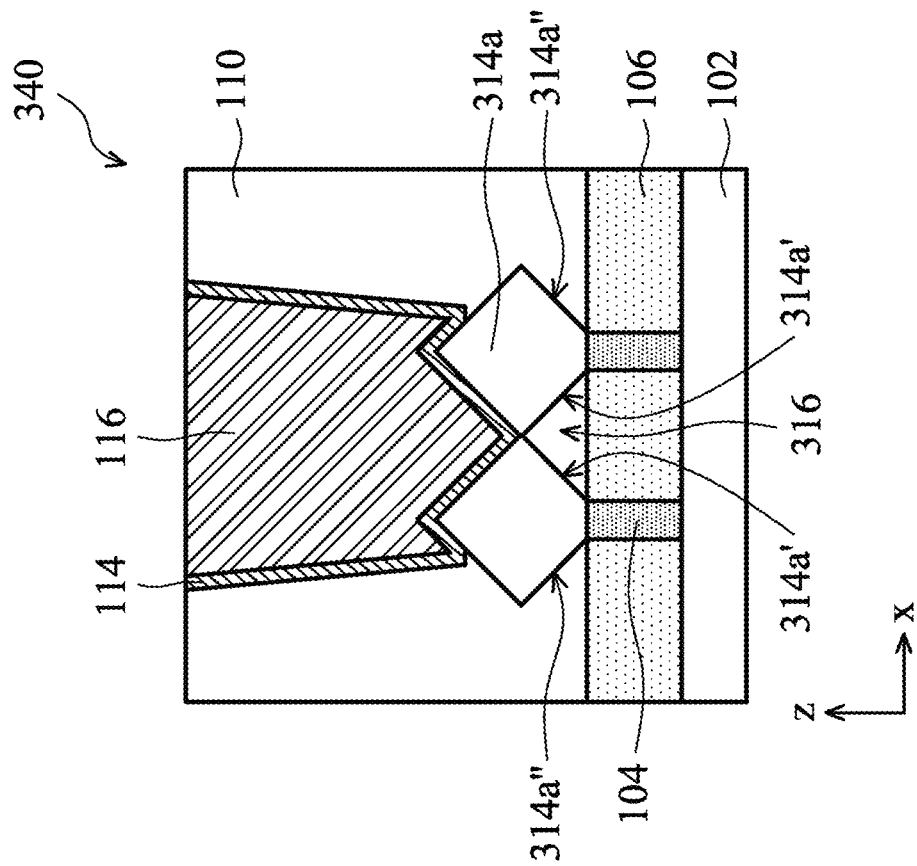
Figure 10P:
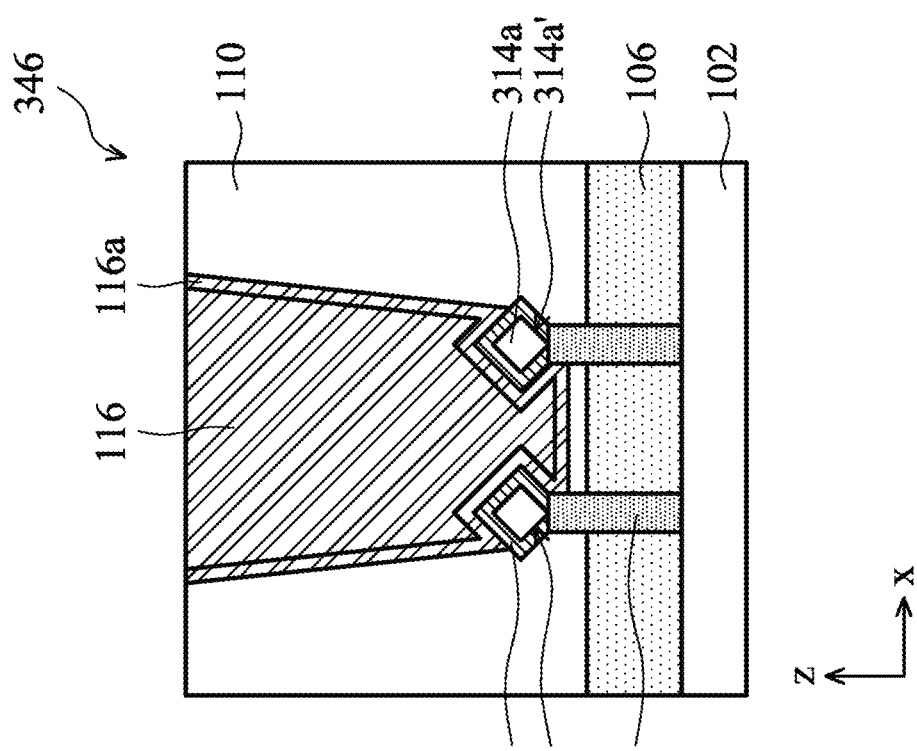

FIGS. 10C-10P show S/D regions of various devices (devices 320, 322, 324, 326, 328, 330, 332, 334, 336, 338, 340, 342, 344, and 346 respectively) constructed according to aspects of the present disclosure. Each of the devices 320-346 may have a channel region and a gate stack constructed similar to the devices 100, 200, and 300. For example, each of the devices 320-346 may have a fin-like channel engaged by a gate stack on three sides of the channel, such as shown in FIG. 9A; or each of them may have a horizontal channel wrapped around by a gate stack, such as shown in FIG. 10A. Alternatively, each of the devices 320-346 may have a channel region and a gate stack constructed differently from those of the devices 100, 200, and 300. The devices 100, 200, 300, and 320-346 are non-limiting examples. Further examples may be constructed by combining, substituting, and/or reconfiguring various features of these devices. For the purposes of simplicity, only the S/D regions of the devices 320-346 are shown in the respective figures, which are described below.

Referring to FIG. 10C, the device 320 includes a substrate 102, two fins 104, two S/D regions 314a formed over the two fins 104, an isolation structure 106, an ILD layer 110, a first contact layer 114, and a second contact layer 116. The fins 104 extend above a top surface of the isolation structure 106. The S/D regions 314a each have a diamond shape and are disposed over top surfaces of the fins 104. The first contact layer 114 wraps around all surfaces (or sides) of the S/D regions 314a. A gap between the S/D regions 314a has a dimension (along the "y" direction) greater than twice of the thickness of the first contact layer 114. Further, another gap between the S/D regions 314 and the ILD layer 110 has a dimension (along the "y" direction) greater than twice of the thickness of the first contact layer 114. The device 320 may be formed by an embodiment of the method 10 (FIG. 1). For example, a device precursor 320 is received at the operation 12, which includes the substrate 102, the isolation structure 106, the fins 104, the S/D regions 314a, and the ILD layer 110. The S/D regions 314a are buried in the ILD layer 110. Subsequently, the ILD layer 110 is etched at the operation 14 to expose all surfaces of the S/D regions 314a. Next, the first contact layer 114 is formed at the operation 16. The first contact layer 114 wraps around all surfaces of the S/D regions 134. Thereafter, the second contact layer 116 is formed over the first contact layer 114. Even though FIG. 10C illustrates the device 320 having two fins 104, in various embodiments, the device 320 may include any number of fins 104, such as one fin, two fins, three fins, and so on. In one example, the device 320 may include one hundred fins 104.

Referring to FIG. 10D, the device 322 includes a substrate 102, two fins 104, two S/D regions 314a formed over the two fins 104, an isolation structure 106, an ILD layer 110, a first contact layer 114, and a second contact layer 116. Top surfaces of the fins 104 and a top surface of the isolation structure 106 are substantially co-planar. The S/D regions 314a each have a diamond shape and are disposed over the top surfaces of the fins 104. The first contact layer 114 fully covers two upwardly facing surfaces of the S/D regions 314a, but only partially covers two downwardly facing surfaces of the S/D regions 314a. A gap between the S/D regions 314a has a dimension (along the "y" direction) less than twice of the thickness of the first contact layer 114. As a result, the respective portions of the first contact layer 114 (on surfaces of the two S/D regions 314a) merge in the gap. Further, another gap between the S/D regions 314 and the ILD layer 110 has a dimension (along the "y" direction) less than twice of the thickness of the first contact layer 114. As a result, the respective portions of the first contact layer 114 (on sidewalls of the ILD layer 110 and on surfaces of the S/D regions 314a) merge in the gap. The device 322 may be formed by an embodiment of the method 10 (FIG. 1), as discussed above. Further, in various embodiments, the device 322 may include any number of fins 104, such as one fin, two fins, three fins, and so on. In one example, the device 322 may include one hundred fins 104.

Referring to FIG. 10E, the device 324 includes a substrate 102, two fins 104, two S/D regions 314a formed over the two fins 104, an isolation structure 106, an ILD layer 110, a first contact layer 114, and a second contact layer 116. Top surfaces of the fins 104 and a top surface of the isolation structure 106 are substantially co-planar. The S/D regions 314a each have a diamond shape and are disposed over the top surfaces of the fins 104. Portions of the S/D regions 314a merge. A space (or gap) 316 is formed below the merged portion, surrounded by two downwardly facing surfaces 314a' of the S/D region 314a and the top surface of the isolation structure 106. The first contact layer 114 fully covers upwardly facing surfaces of the S/D regions 314a, but only partially covers downwardly facing surface 314a" of each of the S/D regions 314a. Further, a gap between the S/D regions 314a and the ILD layer 110 has a dimension (along the "y" direction) less than twice of the thickness of the first contact layer 114. As a result, the respective portions of the first contact layer 114 (on sidewalls of the ILD layer 110 and on surfaces of the S/D regions 314a) merge in the gap. The device 324 may be formed by an embodiment of the method 10 (FIG. 1), as discussed above. Further, in various embodiments, the device 324 may include any number of fins 104, such as one fin, two fins, three fins, and so on. In one example, the device 324 may include one hundred fins 104.

Referring to FIG. 10F, the device 326 includes a substrate 102, two fins 104, a S/D region 314a formed over the two fins 104, an isolation structure 106, an ILD layer 110, a first contact layer 114, and a second contact layer 116. Top surfaces of the fins 104 and a top surface of the isolation structure 106 are substantially co-planar. The S/D region 314a has a hexagonal shape in the "z-y" plane with a top surface, a bottom surface, two upwardly facing surfaces, and two downwardly facing surfaces. The top and bottom surfaces of the S/D region 314a are substantially parallel to the "x-y" plane (see FIG. 2A). The bottom surface of the S/D region 314a is disposed over the top surfaces of the fins 104. The first contact layer 114 fully covers the top surface and the two upwardly facing surfaces of the S/D region 314a, but only partially covers the two downwardly facing surfaces of the S/D region 314a. Further, a gap between the S/D region 314a and the ILD layer 110 has a dimension (along the "y" direction) less than twice of the thickness of the first contact layer 114. As a result, the respective portions of the first contact layer 114 (on sidewalls of the ILD layer 110 and on surfaces of the S/D region 314a) merge in the gap. The device 326 may be formed by an embodiment of the method 10 (FIG. 1), as discussed above. Further, in various embodiments, the device 326 may include any number of fins 104, such as one fin, two fins, three fins, and so on. In one example, the device 326 may include one hundred fins 104.

Referring to FIG. 10G, the device 328 includes a substrate 102, a fin 104, an S/D region 314a formed over the fin 104, an isolation structure 106, an ILD layer 110, a first contact layer 114, and a second contact layer 116. A top surface of the fin 104 and a top surface of the isolation structure 106 are substantially co-planar. The S/D region 314a has a hexagonal shape in the "z-y" plane with a top surface, a bottom surface, two upwardly facing surfaces, and two downwardly facing surfaces. The top and bottom surfaces of the S/D region 314a are substantially parallel to the "x-y" plane (see FIG. 2A). The bottom surface of the S/D region 314a is disposed over the top surface of the fin 104. The first contact layer 114 fully covers the top surface and the two upwardly facing surfaces of the S/D region 314a, but only partially covers the two downwardly facing surfaces of the S/D region 314a. Further, a gap between the S/D region 314a and the ILD layer 110 has a dimension (along the "y" direction) less than twice of the thickness of the first contact layer 114. As a result, the respective portions of the first contact layer 114 (on sidewalls of the ILD layer 110 and on surfaces of the S/D region 314a) merge in the gap. The device 328 may be formed by an embodiment of the method 10 (FIG. 1), as discussed above. Further, in various embodiments, the device 328 may include any number of fins 104, such as one fin, two fins, three fins, and so on. In one example, the device 328 may include one hundred fins 104.

Referring to FIG. 10H, the device 330 includes a substrate 102, two fins 104, two S/D regions 314a formed over the respective fins 104, an isolation structure 106, an ILD layer 110, a first contact layer 114, and a second contact layer 116. Top surfaces of the fins 104 and a top surface of the isolation structure 106 are substantially co-planar. The S/D regions 314a each have a substantially hexagonal shape in the "z-y" plane with two upwardly facing surfaces, two side surfaces, and two downwardly facing surfaces. The two upwardly facing surfaces are slanted from the "x-y" plane (see FIG. 2A) and meet to form a ridge. The two side surfaces are substantially parallel to the "x-z" plane (see FIG. 2A). The two downwardly facing surfaces are also slanted from the "x-y" plane. The first contact layer 114 fully covers the two upwardly facing surfaces of each S/D region 314a, but only partially covers the two side surfaces of each S/D region 314a. The device 330 may be formed by an embodiment of the method 10 (FIG. 1), as discussed above. Further, in various embodiments, the device 330 may include any number of fins 104, such as one fin, two fins, three fins, and so on. In one example, the device 330 may include one hundred fins 104.

Referring to FIG. 10I, the device 332 is similar to the device 330 in many respects. Some differences are noted below. In the device 332, the first contact layer 114 does not cover the two outer side surfaces 314a' of the S/D region 314a. The first contact layer 114 fully covers the two inner upwardly facing surfaces 314a''', but full or partially covers the two inner side surfaces 314a'' and the two outer upwardly facing surfaces 314a''''. The device 332 may be formed by an embodiment of the method 10 (FIG. 1), as discussed above. For example, when etching the ILD layer 110 at operation 14, the etching dimensions are controlled such that the surfaces 314a' are not exposed by the etching process.

Referring to FIG. 10J, the device 334 is similar to the device 332 in many respects. Some differences are noted below. In the device 334, the fins 104 extend above a top surface of the isolation structure 106 and the S/D regions 314a are each disposed (e.g., by an epitaxial growth process) over the respective fins 104 without recessing the fins 104. As a result, the S/D regions 314a each wrap around the respective fins 104. The device 334 may be formed by an embodiment of the method 10 (FIG. 1), as discussed above.

Referring to FIG. 10K, the device 336 is similar to the device 320 (FIG. 10C) in many respects. Some differences are noted below. In the device 336, two outer downwardly facing surfaces 314a' of the S/D regions 314a are not covered by the first contact layer 114. The first contact layer 114 fully covers two inner upwardly facing surfaces 314a'' and two inner downwardly facing surfaces 314a''', and partially or fully covers two outer upwardly facing surfaces 314a''''. The device 336 may be formed by an embodiment of the method 10 (FIG. 1), as discussed above. For example, when etching the ILD layer 110 at operation 14, the etching dimensions are controlled such that the surfaces 314a' are not exposed by the etching process.

Referring to FIG. 10L, the device 338 is similar to the device 322 (FIG. 10D) in many respects. Some differences are noted below. In the device 338, two outer downwardly facing surfaces 314a' of the S/D regions 314a are not covered by the first contact layer 114. The first contact layer 114 fully covers two inner upwardly facing surfaces 314a'', and fully or partially covers two inner downwardly facing surfaces 314a''' and two outer upwardly facing surfaces 314a''''.

Referring to FIG. 10M, the device 340 is similar to the device 324 (FIG. 10E) in many respects. Some differences are noted below. In the device 340, the first contact layer 114 fully covers two inner upwardly facing surfaces of the S/D regions 314a, and fully or partially covers two outer upwardly facing surfaces of the S/D regions 314a. Further, it does not cover the downwardly facing surfaces 314a' and 314a''.

Referring to FIG. 10N, the device 342 is similar to the device 326 (FIG. 10F) in many respects. Some differences are noted below. In the device 342, the first contact layer fully covers the top surface of the S/D region 314a, and fully or partially covers the two upwardly facing surfaces of the S/D region 314a. The first contact layer does not cover the two downwardly facing surfaces of the S/D region 314a.

Figure 10O:
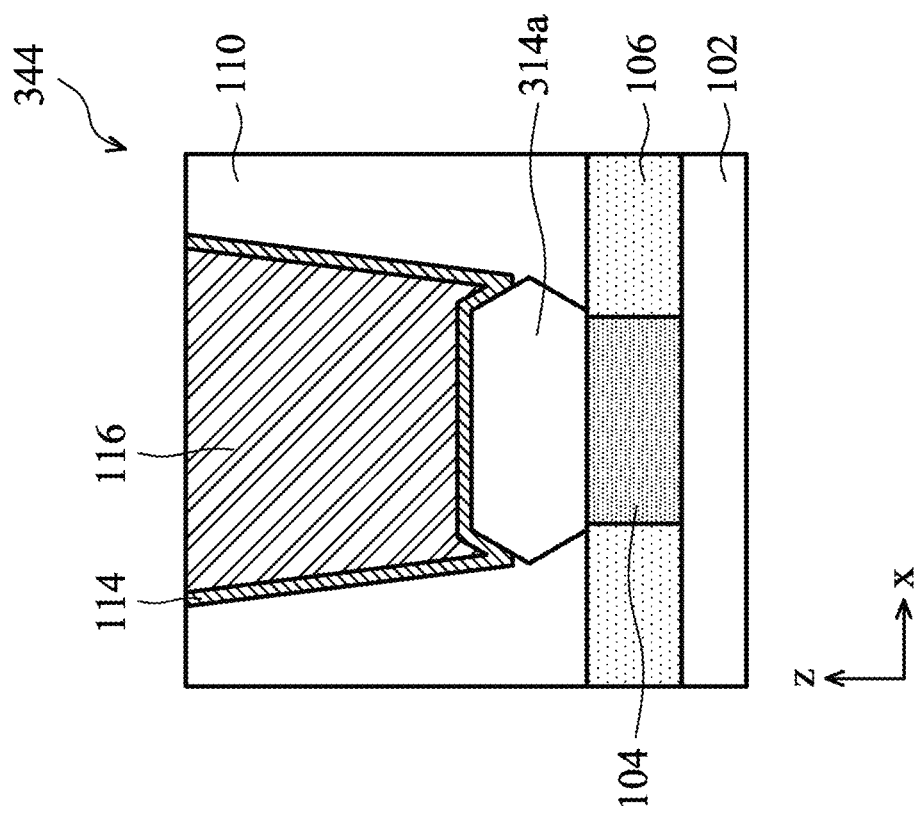

Referring to FIG. 10O, the device 344 is similar to the device 328 (FIG. 10G) in many respects. Some differences are noted below. In the device 344, the first contact layer fully covers the top surface of the S/D region 314a, and fully or partially covers the two upwardly facing surfaces of the S/D region 314a. The first contact layer does not cover the two downwardly facing surfaces of the S/D region 314a.

Referring to FIG. 10P, the device 346 is similar to the device 336 (FIG. 10K) in many respects. Some differences are noted below. In the device 346, the first contact layer 114 fully covers all surfaces of the S/D regions 314a. Further, the device 346 optionally includes a barrier metal layer 116a between the second contact layer 116 and the ILD layer 110 and between the second contact layer 116 and the first contact layer 114. In an embodiment, the barrier metal layer 116a includes a metal nitride (e.g., TaN) for preventing the metal elements of the second contact layer 116 from migrating to adjacent features. The barrier metal layer 116a is conductive and has a conformal profile, similar to the first contact layer 114 of FIG. 10K. The device 346 may be formed by an embodiment of the method 10 (FIG. 1), as discussed above. For example, a device precursor 346 is received at operation 12 (FIG. 1) that includes the substrate 102, the fins 104, and the isolation structure 106. The fins 104 extend above the top surface of the isolation structure 106. The device 346 further includes the S/D regions 314a disposed over the respective fins 104. Next, the first contact layer 114 is formed (the operation 16) to fully cover the surfaces of the S/D regions 314a. Next, the ILD layer 110 is deposited over the device 346 and covers the first contact layer 114, the S/D regions 314a, and the fins 104. Next, the ILD layer 110 is etched (the operation 14) to form an opening which exposes portions of the first contact layer 114 except the portions on the two outer downwardly facing surfaces 314a' of the S/D regions 314a. Next, the second contact layer 116 is formed in the opening (the operation 18). In the present embodiment, the operation 18 includes forming the barrier metal layer 116a (e.g., using CVD or PVD techniques) before the formation of the second contact layer 116.

In various embodiments, each of the devices 322, 324, 326, 328, 330, 332, 334, 336, 338, 340, 342, and 344 may be formed to have the first contact layer 114 fully wrapping the S/D regions 314a before the respective ILD layer 110 is formed, such as discussed with reference to FIG. 10P.

Fourth Embodiment

The fourth embodiment of the present disclosure is now described with reference to FIGS. 11A and 11B, wherein the device 400 has been fabricated according to some embodiments of the method 10. Discussions applicable to both the devices 100 and 400 are abbreviated or omitted below for the sake of simplicity.

Referring to FIGS. 11A and 11B, the device 400 includes two horizontal (in the "x-y" plane) rod-shaped active regions 404. Source and drain regions 404a and channel 404b are formed in the active regions 404 and have the same rod shape. In embodiments, the number and shapes of the active regions 404 may vary. For example, the active regions 404 may have a bar shape or other suitable shapes, and there may be one or more of such active regions in the device 400. Similar to the device 300, the device 400 is also a HGAA device as its gate 108 wraps around the channels 404b. One difference between the devices 300 and 400 lies in the configuration of their S/D regions. The S/D regions 404a are isolated from the substrate 102 and the fin 104 at least within the contact holes. Therefore, the first contact layer 114 wraps around each of the S/D regions 404a, providing the maximum contact area. As shown in FIGS. 11A and 11B, a portion 116A of the second contact layer 116 fills the space between the S/D regions 404a after the first contact layer 114 have been formed around thereof. In another embodiment where a vertical distance between the two S/D regions 404a along the z direction is not greater than two times of the thickness of the first contact layer 114, the first contact layer 114 around each of the S/D regions 404a physically contact each other. The process of forming the S/D contacts for the device 400 is the same as what have been discussed with respect to the devices 100. An exemplary process of forming the device 400 prior to the S/D contact formation can be found in U.S. Pat. No. 8,815,691 entitled "Method of Fabricating a Gate All Around Device," the contents of which are hereby incorporated by reference in their entirety.

Fifth Embodiment

Figure 12:
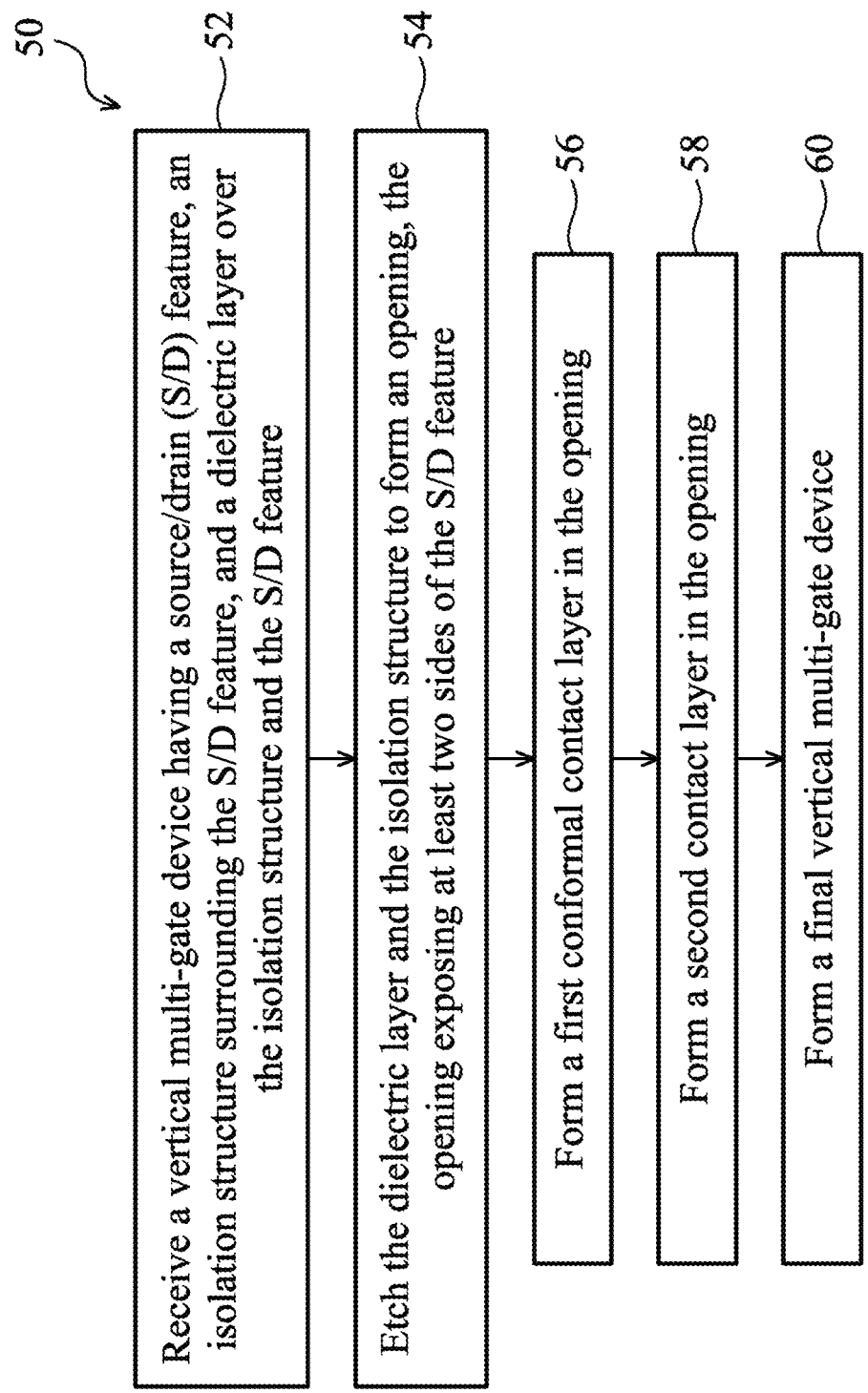
FIG. 12 shows a flow chart of a method of fabricating a semiconductor device, according to various aspects of the present disclosure.

The fifth embodiment of the present disclosure is now described with reference to FIGS. 12-18. FIG. 12 shows a flow chart of a method 50 of forming a semiconductor device, particularly a semiconductor device having a vertical multi-gate structure, according to various aspects of the present disclosure. The method 50 is merely an example, and is not intended to limit the present disclosure beyond what is explicitly recited in the claims. Additional operations can be provided before, during, and after each of the method 50, and some operations described can be replaced, eliminated, or moved around for additional embodiments of the method.

At operation 52, the method 50 (FIG. 12) receives a vertical multi-gate device prior to the S/D contact formation. An exemplary vertical multi-gate device, the device 500, is shown in FIGS. 13A and 13B. FIG. 13A is a schematic perspective view of the device 500 and FIG. 13B is a top view of the device 500 (with the ILD layer 110 removed).

The device 500 includes a substrate 102, a first S/D region (or feature) 104a as a mesa on the substrate 102, and an isolation structure 106 over the substrate 102 and surrounding the first S/D region 104a. The device 500 further includes two rod-shaped mesas over the first S/D region 104a and extending upwardly along the "z" direction. The middle portions of the two rod-shaped mesas provide two transistor channels 104b. The top portions of the two rod-shaped mesas provide two S/D regions 104c. The first S/D region 104a, the channel 104b, and the second S/D region 104c are arranged vertically over the substrate. A gate 108 wraps around the transistor channels 104b. Therefore, the device 500 is a vertical gate-all-round (VGAA) device. The device 500 further includes the ILD layer 110 over the substrate 102 and the isolation structure 106, filling in the spaces between the various structures. In embodiments, the ILD layer 110 may include one or more dielectric layers. The material and composition of the various elements 102, 104a-c, 106, 108, and 110 are similar to those of the device 100. Exemplary processes of forming the device 500 prior to the S/D contact formation can be found in U.S. Pat. No. 8,742,492 entitled "Device with a Vertical Gate Structure" and U.S. Pat. No. 8,754,470 entitled "Vertical Tunneling Field-Effect Transistor Cell and Fabricating the Same," the contents of which are hereby incorporated by reference in their entirety.

Figure 14B:
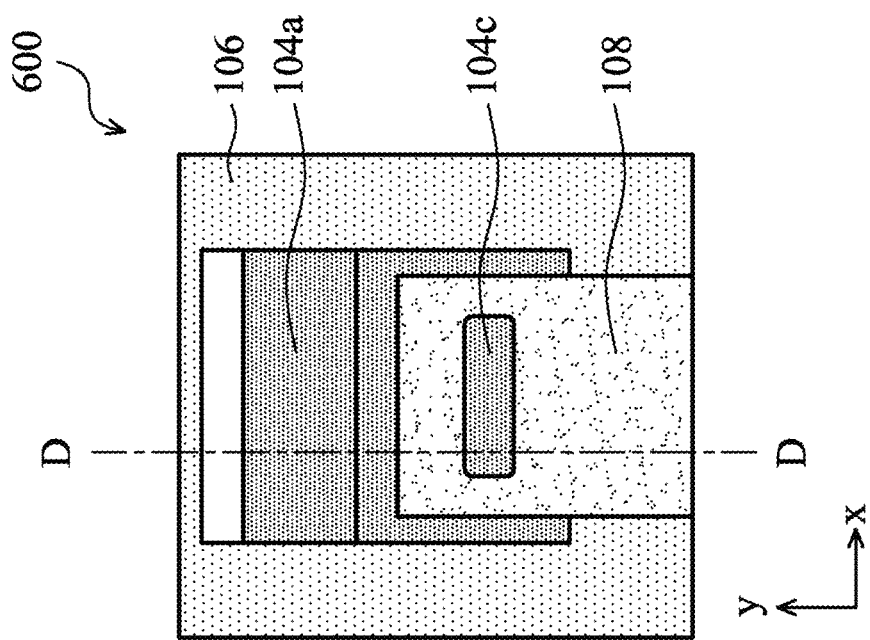
Figure 14A:
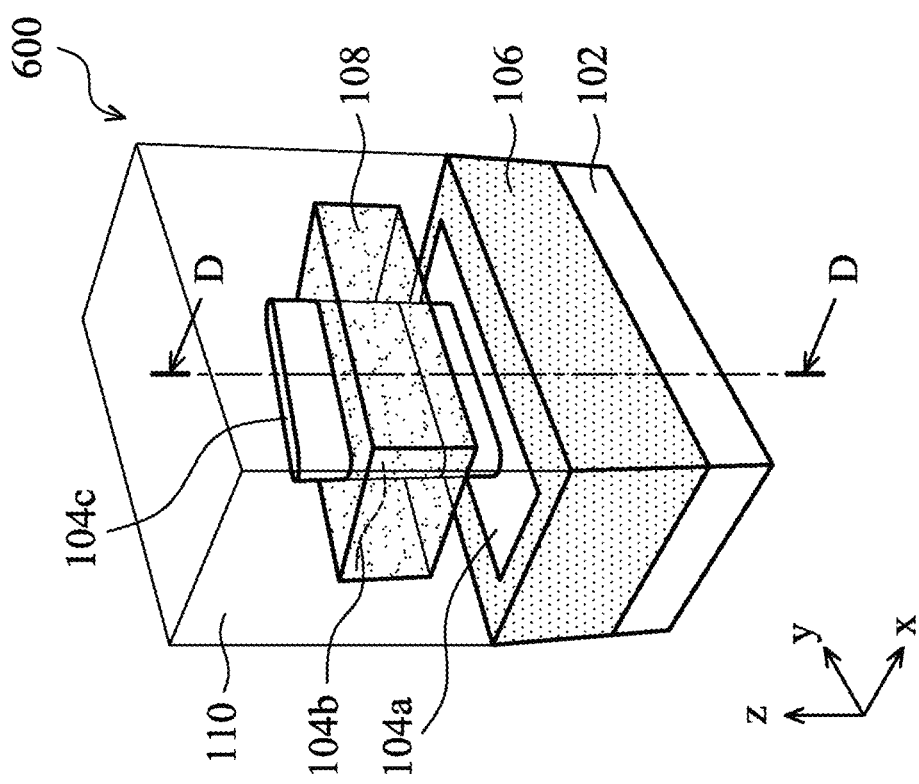
Figure 15:
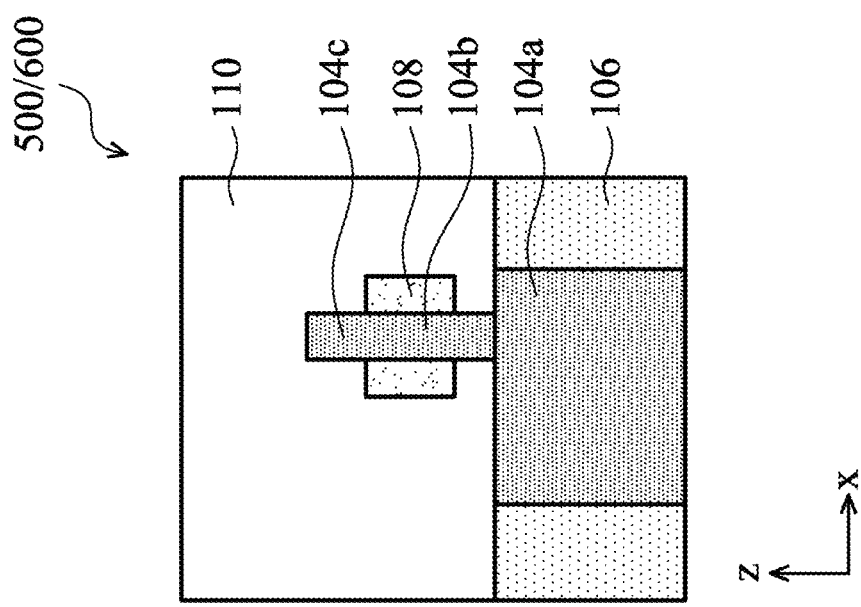

Another exemplary vertical multi-gate device, the device 600, is shown in FIGS. 14A and 14B. FIG. 14A is a schematic perspective view of the device 600 and FIG. 14B is a top view of the device 600 (with the ILD layer 110 removed). Many respects of the device 600 are similar to those of the device 500. One difference between the two devices lies in the shape of the mesa over the first S/D region 104a. The device 600 has a bar-shaped vertical mesa where the channel 104b and the second S/D region 104c are included or formed therein. The device 600 is also a VGAA device. The devices 500 and 600 may be considered two variants of the same general type of devices, and will be discussed collectively below. In particular, FIGS. 15-18 show cross-sectional views of the devices 500/600 along the "C—C" line of FIG. 13A for the device 500 and along the "D—D" line of FIG. 14A for the device 600. FIG. 15 illustrates the devices 500/600 prior to the S/D contact formation.

Figure 16:
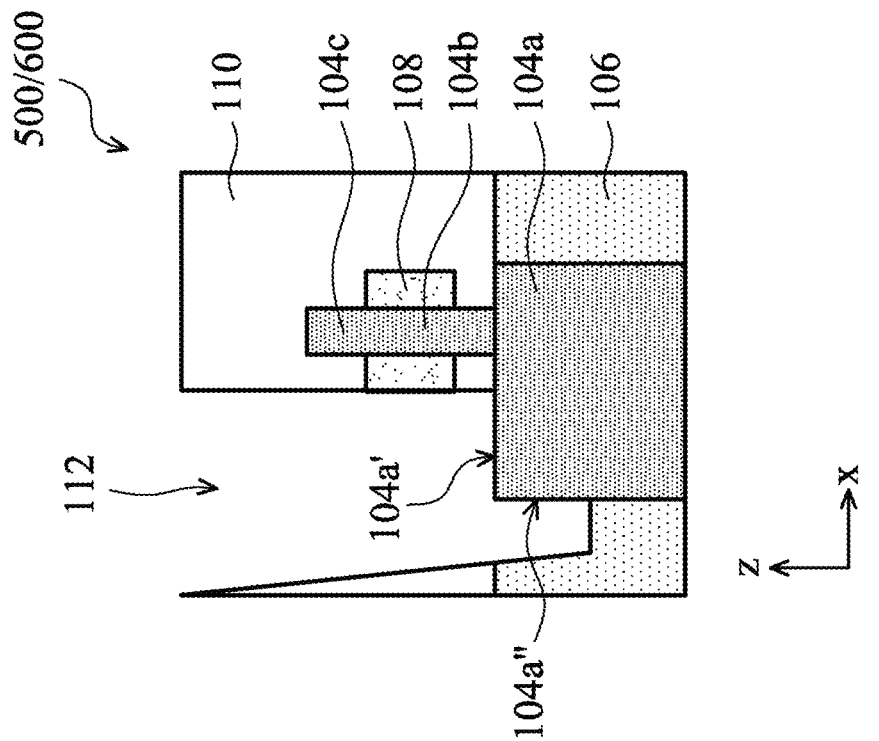

At operation 54, the method 50 (FIG. 12) etches the ILD layer 110 and the isolation structure 106 to form an opening 112. Referring to FIG. 16, the opening 112 exposes a portion of the top surface 104a' and a portion of the sidewall 104a" of the first S/D region 104a. Since the isolation structure 106 initially surrounds the first S/D region 104a, it is partially removed in the etching process to expose the surface 104a". The opening 112 is deeper than conventional S/D contact holes which typically stop at the top surface 104a'. Therefore, the opening 112 offers more contact areas to the first S/D region 104a than the conventional S/D contact holes. In some embodiments, the opening 112 may expose more than two surfaces of the first S/D region 104, for example, a top surface and two sidewall surfaces, to further increase the contact area. The etching processes may include a suitable wet etch, dry (plasma) etch, and/or other processes. In embodiments, the devices 500/600 include a contact etch stop (CES) layer over the first S/D region 104a and underneath the ILD layer 110. To further this embodiment, the partial removal of the CES layer can be performed in a manner similar to that of the method 10 with reference to FIG. 3B.

Figure 17:
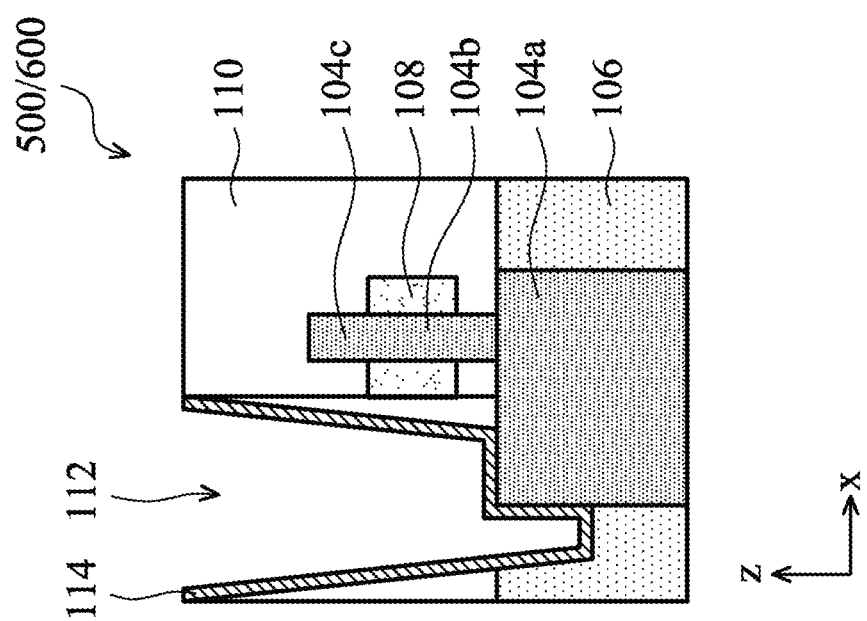

At operation 56, the method 50 (FIG. 12) forms a first contact layer 114 in the opening 112. Referring to FIG. 17, the first contact layer 114 is formed over the surfaces of the opening 112. In particular, it is formed over the two surfaces 104a' and 104a" (FIG. 16) of the first S/D region 104a. The first contact layer 114 has a conformal profile. In an embodiment, the first contact layer 114 has a thickness ranging from about 2 nm to about 10 nm. The material and formation of the first contact layer 114 are similar to those discussed with reference to FIGS. 4A and 4B. In various embodiments, the material of the first contact layer 114 offers low or negligible energy barrier for charge carriers flowing into and out of the transistor channel. The first contact material coupled with increased contact areas to the first S/D region 104a reduces the S/D contact resistance thereof.

Figure 18:
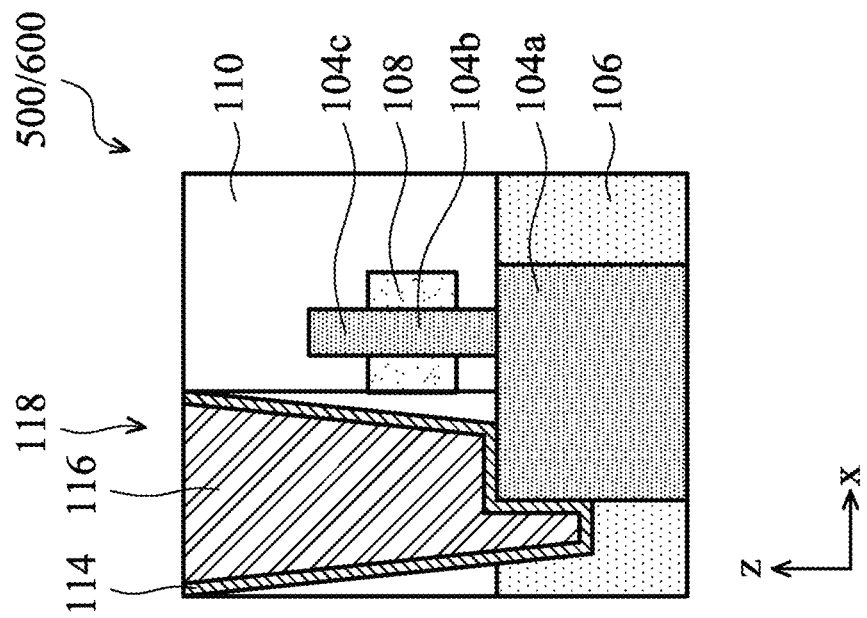

At operation 58, the method 50 (FIG. 12) forms a second contact layer 116 in the opening 112 over the first contact layer 114. Referring to FIG. 18, an S/D contact 118s is formed in the opening 112, conductively connecting to the first S/D region 104a. The S/D contact 118s includes the first contact layer 114 and the second contact layer 116. Other respects of the contact 118s are similar to those discussed with reference to FIGS. 5A and 5B. In the present embodiment, the S/D region 104a is a source region of the device 500/600 and the S/D contact 118s is a source contact.

Figure 19:
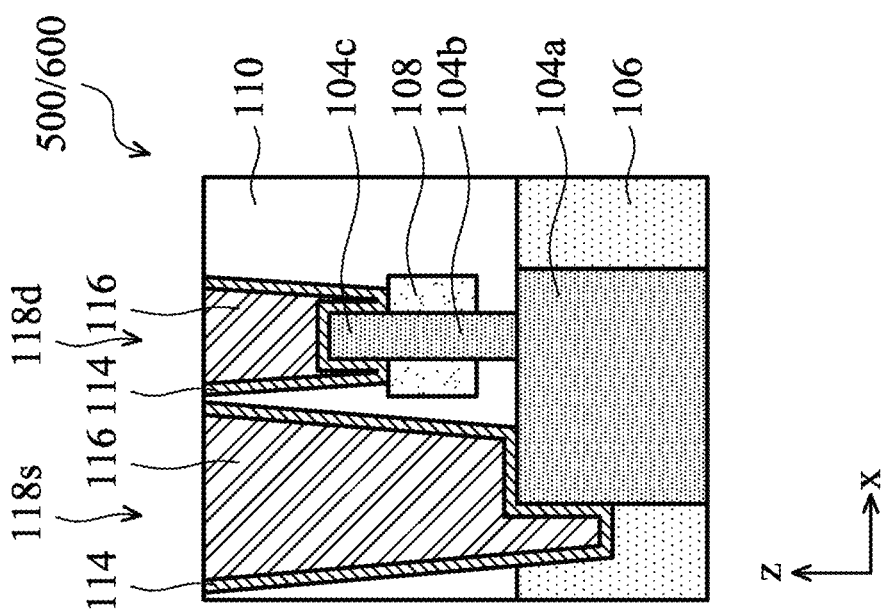

At operation 60, the method 50 (FIG. 12) performs further steps to complete the fabrication of the devices 500/600. For example, operation 50 may form another S/D contact 118d electrically connecting the second S/D region 104c, as shown in FIG. 19. Referring to FIG. 19, the S/D contact 118d also includes a first contact layer 114 and a second contact layer 116, wherein the first contact layer 114 wraps around three sides of the S/D region 104c. In an embodiment, the S/D contact 118d is formed by etching the ILD layer 110 to form an opening that exposes the three sides of the S/D region 104c (similar to the operation 54), forming the first contact layer 114 in the opening (the operation 56), and forming the second contact layer 116 over the first contact layer 114 (the operation 58). In an embodiment, the S/D contacts 118s and 118d are formed by the same process that includes the etching of the ILD layer 110 (the operation 56), the forming of the first contact layer 114 (the operation 56), and the forming of the second contact layer 116 (the operation 58). In the present embodiment, the S/D region 104c is a drain region of the device 500/600 and the S/D contact 118d is a drain contact.

The method 50 (FIG. 12) may perform further steps to complete the fabrication of the devices 500/600. For example, it may form a gate contact electrically connecting the gate 108, and form metal interconnects connecting the multi-gate FET to other portions of the device 100 to form a complete IC.

Figure 20:
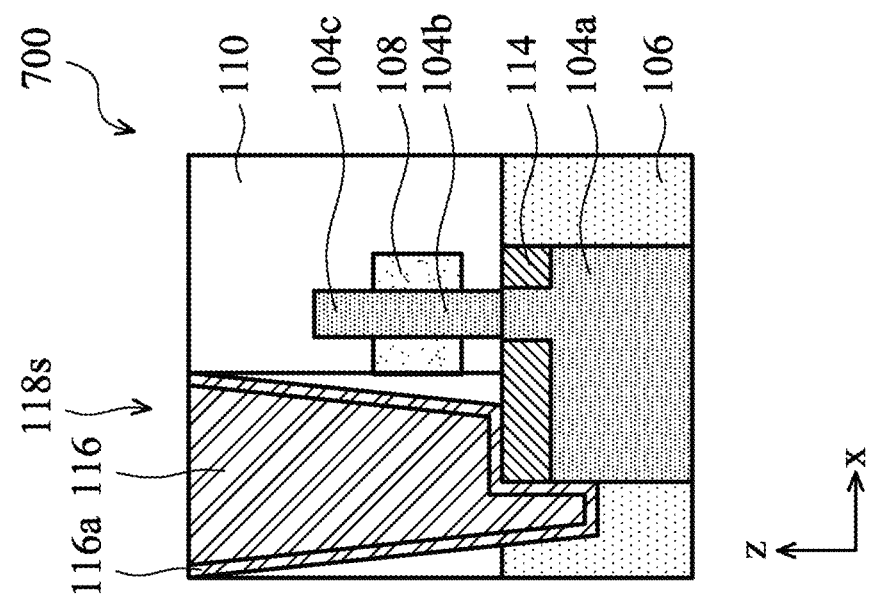
FIG. 20 is a cross-sectional view of another semiconductor device formed with an embodiment of the method of FIG. 2.

FIG. 20 shows an embodiment of the device 700, constructed according to various aspects of the present disclosure. Some differences between the device 700 and the device 500/600 (FIG. 18) are noted. One difference is that the first contact layer 114 is formed over the entire top surface of the source region 104a not covered by the vertical mesa. Another difference is that the source contact 118s in the device 700 optionally includes a barrier metal layer 116a between the second contact layer 116 and the layers surrounding the second contact layer 116. Notably, the source contact 118s contacts at least a portion of the top surface and a portion of the sidewall surface of the source region 104a, reducing the source contact resistance. The barrier metal layer 116a is conductive and has a conformal profile, similar to the first contact layer 114 of FIG. 18. In an embodiment, the barrier metal layer 116a includes a metal nitride (e.g., TaN).

Figure 22:
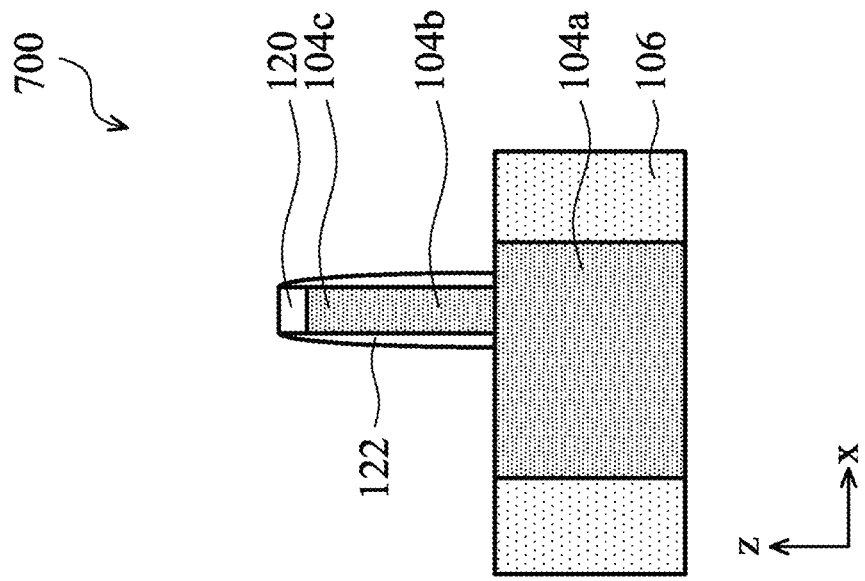
FIGS. 21, 22, 23, 24, and 25 are cross-sectional views of forming the semiconductor device of FIG. 20, in accordance with some embodiments.
Figure 21:
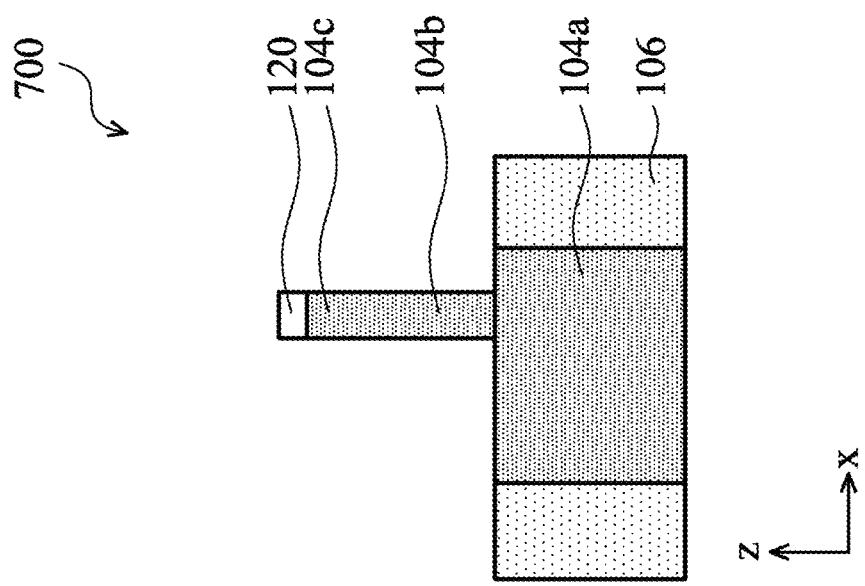
Figure 24:
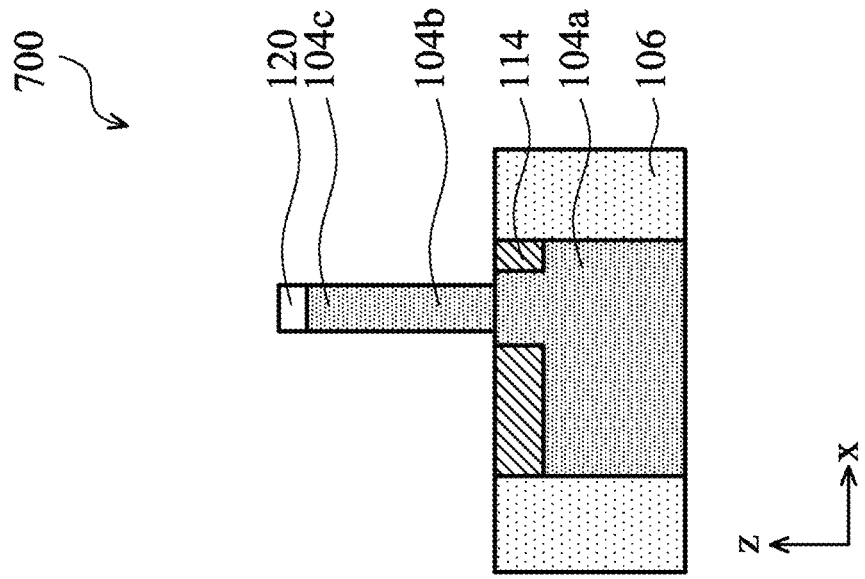
Figure 23:
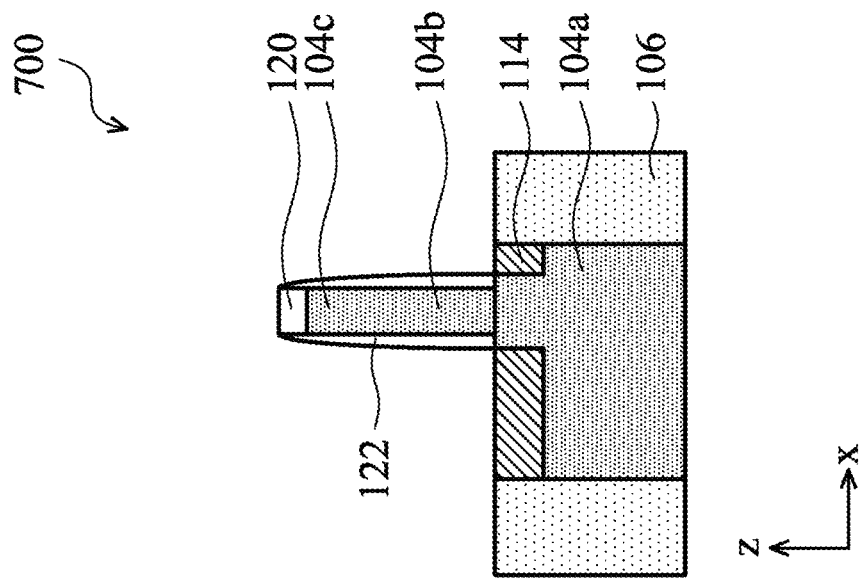
Figure 25:
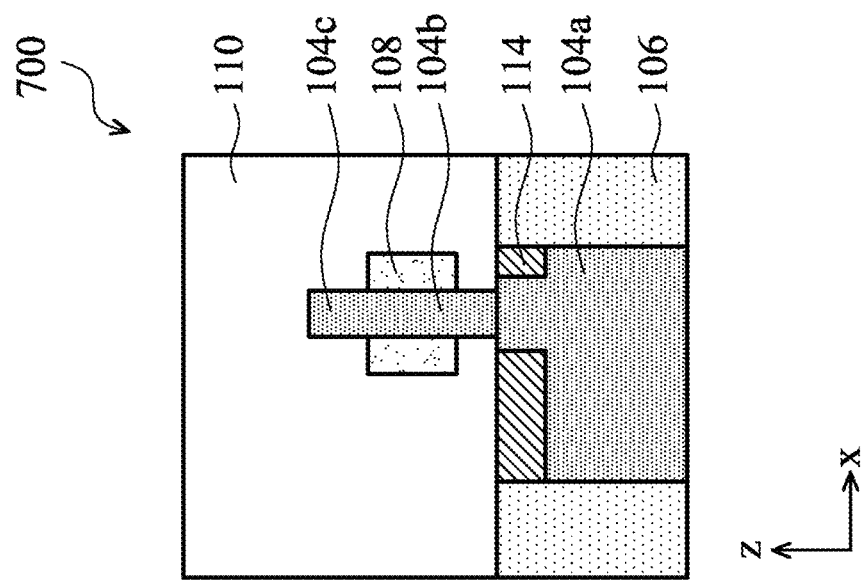

The contact layers 116a and 116 of the device 700 may be formed with an embodiment of the method 50 (FIG. 12), as discussed above, wherein the barrier metal layer 116a is deposited (e.g., by a CVD or PVD process) in the opening 112 (FIG. 16) followed by the deposition of the second contact layer 116 (FIG. 18). The formation of the first contact layer 114 is briefly discussed below. In an embodiment, first, a hard mask 120 and a vertical mesa (104b-c) are formed over the source region 104a (FIG. 21) using various deposition and etching processes. Next, a spacer feature 122 is formed around the vertical mesa (FIG. 22). The spacer feature 122 may be formed by CVD of silicon nitride followed by reactive ion etching, in one example. Next, the first contact layer 114 is formed over the source region 104a (FIG. 23) using one of the techniques discussed above. Next, the spacer feature 122 is removed (FIG. 24), and the ILD layer 110 and the gate 108 are formed (FIG. 25). Subsequently, an embodiment of the method 50 (FIG. 12) is used to form the barrier metal layer 116a and the second contact layer 116 as shown in FIG. 20, and may further form a drain contact 118d as shown in FIG. 19.

Although not intended to be limiting, one or more embodiments of the present disclosure provide many benefits to a semiconductor device and the formation thereof. For example, source/drain (S/D) contact holes etched according to embodiments of the present disclosure provide larger contact areas to S/D regions of a transistor than conventional S/D contact holes. Contact holes of the present disclosure expose multiple surfaces of the S/D regions, such as a top surface, one or more sidewall surfaces, and/or surfaces all-around. The larger contact areas contribute to lower S/D contact resistance. Furthermore, S/D contacts formed according to embodiments of the present disclosure include two layers of contact materials. In particular, the first contact layer is conformal and is in direct contact with the semiconductor material of the respective S/D region. The material(s) of the first contact layer offers low or negligible energy barrier for charge carriers to flow into or out of the transistor channel. The contact material coupled with the large contact area provides ultra-low contact resistivity. In experiments, contact resistivity in the range of $1 \times e^{-10}$ to $1 \times e^{-8}$ ohm·cm$^2$ has been achieved.

In one exemplary aspect, the present disclosure is directed to a semiconductor device. The semiconductor device includes a substrate, first and second source/drain (S/D) regions, a channel between the first and second S/D regions, a gate engaging the channel, and a contact feature connecting to the first S/D region. The contact feature includes a first contact layer and a second contact layer over the first contact layer. The first contact layer has a conformal cross-sectional profile and either is in contact with the first S/D region on at least two sides of the first S/D region or wraps around the first S/D region.

In another exemplary aspect, the present disclosure is directed to a method of forming a contact in a vertical gate-all-around (VGAA) device. The method includes receiving a VGAA device having a substrate, a first source/drain (S/D) region over the substrate, an isolation structure over the substrate and surrounding the first S/D region, a channel over the first S/D region, a second S/D region over the channel, a gate wrapping around the channel, and a dielectric layer over the isolation structure and the first S/D region. The method further includes etching the dielectric layer and the isolation structure to form an opening, wherein the opening exposes at least two sides of the first S/D region. The method further includes forming a first contact layer in the opening, wherein the first contact layer has a conformal cross-sectional profile and is in contact with the first S/D region. The method further includes forming a second contact layer in the opening over the first contact layer.

In another exemplary aspect, the present disclosure is directed to a method of forming a contact in a multi-gate semiconductor device. The method includes receiving a multi-gate semiconductor device having a substrate, first and second source/drain (S/D) regions, a channel between the first and second S/D regions, a gate engaging the channel, and a dielectric layer over the first S/D region. The method further includes etching the dielectric layer to form an opening, wherein the opening exposes at least two sides of the first S/D region or wraps around the first S/D region. The method further includes forming a first contact layer in the opening, wherein the first contact layer has a conformal cross-sectional profile and is in contact with the first S/D region. The method further includes forming a second contact layer in the opening over the first contact layer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a first fin structure disposed over a semiconductor substrate;
   a second fin structure disposed over the semiconductor substrate;
   a first source/drain feature disposed directly over the first fin structure and being diamond-shaped;
   a second source/drain feature disposed directly over the second fin structure and being diamond-shaped;
   a first contact layer disposed directly on surfaces of the first source/drain feature and surfaces of the second source/drain feature;
   a dielectric layer over the semiconductor substrate; and
   a contact feature disposed over the first contact layer and extending through the dielectric layer,
   wherein the contact feature comprises a second contact layer wrapped around by a barrier layer,
   wherein the second contact layer is spaced apart from the dielectric layer, the first source/drain feature, and the second source/drain feature by the barrier layer,
   wherein a portion of the contact feature extends between the first source/drain feature and the second source/drain feature.

2. The device of claim 1, wherein the first contact layer is formed of a semiconductor-metal alloy comprising titanium, cobalt, nickel, or nickel cobalt.

3. The device of claim 1, wherein the first contact layer comprises a III-V semiconductor material.

4. The device of claim 3, wherein the first contact layer comprises InAs, InGaAs, or InP.

5. The device of claim 1,
   wherein the second contact layer comprises tungsten, cobalt, or copper,
   wherein the barrier layer comprises metal nitride.

6. The device of claim 5, wherein the barrier layer comprises tantalum nitride.

7. The device of claim 1, further comprising:
   an isolation feature disposed between the first fin structure and the second fin structure,
   wherein the portion of the contact feature is spaced apart from the isolation feature.

8. A semiconductor structure, comprising:
   a substrate;
   a isolation structure over the substrate
   a first fin structure extending from the substrate and rising above the isolation structure;
   a second fin structure extending from the substrate and rising above the isolation structure;
   a first source/drain feature disposed directly over the first fin structure;
   a second source/drain feature disposed directly over the second fin structure;
   a semiconductor-metal alloy layer disposed directly on surfaces of the first source/drain feature and surfaces of the second source/drain feature;
   a dielectric layer over the isolation structure, the first source/drain feature and the second source/drain feature; and
   a contact feature extending through the dielectric layer and in contact with the semiconductor-metal alloy layer,
   wherein the dielectric layer is in direct contact with the semiconductor-metal alloy layer.

9. The semiconductor structure of claim 8,
   wherein the dielectric layer comprises tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG),
   wherein the semiconductor-metal alloy layer comprises titanium, cobalt, nickel, nickel cobalt, InAs, InGaAs, InP, or Ge.

10. The semiconductor structure of claim 8, wherein the contact feature comprises:
    a barrier metal layer in contact with the semiconductor-metal alloy layer and the dielectric layer; and
    a metal fill layer spaced part from the semiconductor-metal alloy layer and the dielectric layer by the barrier metal layer.

11. The semiconductor structure of claim 10,
    wherein the barrier metal layer comprises tantalum nitride (TaN),
    wherein the metal fill layer comprises tungsten (W), copper (Cu), or cobalt (Co).

12. The semiconductor structure of claim 8, wherein a bottom surface of the contact feature is spaced apart from the isolation structure by a portion of the dielectric layer.

13. The semiconductor structure of claim 8, wherein a portion of the contact feature extends between the first fin structure and the second fin structure.

14. A semiconductor structure, comprising:
    a substrate;
    a first fin structure and a second fin structure extending vertically from the substrate and lengthwise along a direction;

a first source/drain feature disposed on the first fin structure, the first source/drain feature comprising two upwardly facing surfaces and two downwardly facing surfaces;
a second source/drain feature disposed on the second fin structure, the second source/drain feature comprising two upwardly facing surfaces and two downwardly facing surfaces;
a first contact layer over and in direct contact with the two upwardly facing surfaces and the two downwardly facing surfaces of the first source/drain feature;
a second contact layer over and in direct contact with the two upwardly facing surfaces and the two downwardly facing surfaces of the second source/drain feature;
a contact feature disposed over and in contact with the first contact layer and the second contact layer; and
a dielectric layer disposed along sidewalls of the contact feature,
wherein the dielectric layer is in direct contact with the first fin structure, the first contact layer, the second fin structure, and the second contact layer.

15. The semiconductor structure of claim 14,
wherein the dielectric layer comprises tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG),
wherein the first contact layer and the second contact layer comprise titanium, cobalt, nickel, nickel cobalt, InAs, InGaAs, InP, or Ge.

16. The semiconductor structure of claim 14, wherein the contact feature comprises:
a barrier metal layer in contact with the first contact layer and the second contact layer; and
a metal fill layer spaced part from the first contact layer and the second contact layer by the barrier metal layer.

17. The semiconductor structure of claim 16,
wherein the barrier metal layer comprises tantalum nitride (TaN),
wherein the metal fill layer comprises tungsten (W), copper (Cu), or cobalt (Co).

18. The semiconductor structure of claim 14, wherein each of the first source/drain feature and the second source/drain feature is diamond-shaped.

19. The semiconductor structure of claim 14, further comprising:
an isolation structure disposed between the first fin structure and the second fin structure,
wherein the first fin structure and the second fin structure rise above a top surface of the isolation structure.

20. The semiconductor structure of claim 14, wherein a bottom surface of the contact feature is lower than bottom surfaces of the first source/drain feature and the second source/drain feature.

* * * * *